(12) United States Patent
Yamanouchi

(10) Patent No.: US 9,813,090 B2
(45) Date of Patent: Nov. 7, 2017

(54) TRANSMISSION DEVICE AND TRANSMISSION METHOD

(71) Applicant: NEC CORPORATION, Tokyo (JP)

(72) Inventor: Shingo Yamanouchi, Tokyo (JP)

(73) Assignee: NEC CORPORATION, Minato-ku, Tokyo (JP)

( * ) Notice: Subject to any disclaimer, the term of this patent is extended or adjusted under 35 U.S.C. 154(b) by 0 days.

(21) Appl. No.: 15/105,643

(22) PCT Filed: Dec. 12, 2014

(86) PCT No.: PCT/JP2014/006206
§ 371 (c)(1),
(2) Date: Jun. 17, 2016

(87) PCT Pub. No.: WO2015/093021
PCT Pub. Date: Jun. 25, 2015

(65) Prior Publication Data
US 2016/0322993 A1 Nov. 3, 2016

(30) Foreign Application Priority Data
Dec. 19, 2013 (JP) .................................. 2013-261930

(51) Int. Cl.
*H04M 1/00* (2006.01)
*H04B 1/04* (2006.01)
(Continued)

(52) U.S. Cl.
CPC ......... *H04B 1/0483* (2013.01); *H03F 1/0294* (2013.01); *H03F 3/19* (2013.01);
(Continued)

(58) Field of Classification Search
CPC .... H04B 1/005; H04B 1/0067; H04B 1/0483; H03F 1/0294; H03F 2200/111; H03F 2200/336
(Continued)

(56) References Cited

U.S. PATENT DOCUMENTS 6,133,788 A * 10/2000 Dent ...................... H03F 1/0294
330/124 R
6,201,452 B1 * 3/2001 Dent ................... H04L 27/2071
330/10
(Continued)

FOREIGN PATENT DOCUMENTS

| JP | 2006-203635 A | 8/2006 |
| JP | 2013-46352 A | 3/2013 |
| WO | 2008/093404 A1 | 8/2008 |

OTHER PUBLICATIONS

Nobuhiko Miki et al., "CA for Bandwidth Extension in LTE-Advanced", NTT Docomo Technical Journal (English version), Jul. 2010, pp. 10-19, vol. 12, No. 2.
(Continued)

Primary Examiner — Duc M Nguyen
(74) Attorney, Agent, or Firm — Sughrue Mion, PLLC

(57) ABSTRACT

In order to realize a power-saving power amplifier compatible with Carrier Aggregation technology using a plurality of bands, with a small size and low cost, while improving the amplitude accuracy and power efficiency, a transmission device of the present invention comprises: a modulation means that generates, from a baseband signal corresponding to each of the plurality of bands, a first and a second constant-envelope signals having different phases; a power amplification means that amplifies respective ones of the first and second constant-envelope signals generated by the modulation means; and a combining means that combines together the first and second constant-envelope signals
(Continued)

amplified by the power amplification means and thereby generating an RF signal in which amplitude information contained in each of the baseband signals corresponding to respective ones of the plurality of bands is restored.

8 Claims, 25 Drawing Sheets

(51) Int. Cl.
    *H03F 3/24* (2006.01)
    *H03F 1/02* (2006.01)
    *H03F 3/19* (2006.01)
    *H04L 27/36* (2006.01)
    *H03F 3/60* (2006.01)
    *H04B 1/00* (2006.01)

(52) U.S. Cl.
    CPC ............ *H03F 3/24* (2013.01); *H03F 3/245* (2013.01); *H03F 3/602* (2013.01); *H04L 27/36* (2013.01); *H03F 2200/102* (2013.01); *H03F 2200/336* (2013.01); *H03F 2200/451* (2013.01); *H04B 1/005* (2013.01); *H04B 1/0067* (2013.01)

(58) Field of Classification Search
    USPC .............................. 455/59, 552.1, 553.1, 103
    See application file for complete search history.

(56) References Cited

U.S. PATENT DOCUMENTS

| | | | | |
|---|---|---|---|---|
| 7,860,151 | B2* | 12/2010 | Djuknic | G01S 19/02 375/135 |
| 8,766,738 | B2* | 7/2014 | Vromans | H03F 1/0294 332/103 |
| 9,432,946 | B2* | 8/2016 | Yamanouchi | H03F 1/0238 |
| 2001/0030581 | A1* | 10/2001 | Dent | H02M 3/1582 330/297 |
| 2002/0101907 | A1* | 8/2002 | Dent | H03F 3/24 375/132 |
| 2005/0215206 | A1* | 9/2005 | Granstrom | H04B 1/0483 455/102 |
| 2007/0178859 | A1* | 8/2007 | Sorrells | H03C 5/00 455/127.3 |
| 2008/0279262 | A1* | 11/2008 | Shanjani | H04B 1/48 375/219 |
| 2009/0088091 | A1* | 4/2009 | Shen | H04B 1/0483 455/102 |
| 2009/0202006 | A1* | 8/2009 | Ahmed | H04L 27/2626 375/260 |
| 2015/0188598 | A1* | 7/2015 | Haralabidis | H04B 1/005 455/77 |

OTHER PUBLICATIONS

International Search Report of PCT/JP2014/006206 dated Mar. 24, 2015.

* cited by examiner

TRANSMISSION DEVICE AND TRANSMISSION METHOD

CROSS REFERENCE TO RELATED APPLICATIONS

This application is a National Stage of International Application No. PCT/JP2014/006206 filed Dec. 12, 2014, claiming priority based on Japanese Patent Application No. 2013-261930, filed Dec. 19, 2013, the contents of all of which are incorporated herein by reference in their entirety.

TECHNICAL FIELD

The present invention relates to a transmission device and a transmission method. In particular, the present invention relates to a transmission device and a transmission method both of which are for transmitting an RF (Radio Frequency) signal of a plurality of carrier frequency bands.

BACKGROUND ART

In a transmission device used in wireless communications, the amount of power consumption is large in a power amplifier (also referred to as PA) for amplifying an RF signal to transmit. Accordingly, in development of such a transmission device, improvement in power efficiency of the power amplifier is considered to be an important issue. In the recent communication standards, linear modulation with a stringent demand on signal distortion has become a mainstream, for the purpose of improving spectrum efficiency.

In a power amplifier, to maintain the linearity, the average output power is set such that the maximum instantaneous output power (hereafter referred to as the peak power) never exceeds the saturated output power. The ratio of the peak power to the average output power is called PAR (Peak-to-Average Ratio), which is an index of power amplifier control. Generally, in a power amplifier, the larger the PAR value of signals to be amplified is, the average output power needs to be set at a lower value with reference to the saturated output power (a backoff is to be set), in order to maintain the linearity.

However, in a general power amplifier, there is a problem in that, with decreasing the ratio of the average output power to the saturated output power, the power efficiency, which is the ratio of output power extracted from the power amplifier to supply power supplied to the power amplifier, decreases.

Each communication standard has its specific value for PAR of an RF signal. In high-speed wireless communications used in recent years, the PAR values are as large as about a few dB to a dozen dB (dB: decibel). Such high-speed wireless communications include CDMA (Code Division Multiple Access), WLAN (Wireless Local Area Network), terrestrial digital broadcasting, LTE (Long Term Evolution) and the like. In each of these high-speed wireless communications, the large PAR value determined in the communication standard is a cause of a large decrease in the power efficiency of a power amplifier.

To solve the problem of decrease in power efficiency of a power amplifier when the average output power is set at a low value, an outphasing technology has been actively studied in recent years.

In the outphasing technology, a transmission signal is separated into two constant-envelope signals (also referred to as outphasing signals), the two constant-envelope signals thus separated are amplified, and the two amplified constant-envelope signals are then combined together. According to the outphasing technology, a transmission signal is separated into two constant-envelope signals having no amplitude fluctuation and no necessity of backoff setting, and accordingly, the constant-envelope signals can be amplified using a nonlinear amplifier with high power efficiency. As a result, amplification of a transmission signal can be performed, achieving both preserving the output signal linearity and improving the power efficiency.

However, the outphasing technology has a problem of increase in amplitude error when the output power is low. Technologies for solving such a problem of an outphasing type PA are disclosed in Patent Literature 1 (PTL 1) and Patent Literature 2 (PTL 2).

PTL 1 discloses a method in which a phase adjuster is disposed at a preceding stage of a power amplifier and, accordingly, correction of an outphasing angle $\alpha$ is performed by means of a phase adjusting function of the phase adjuster.

PTL 2 discloses a method which performs mode switching such that outphasing operation of amplifying constant-amplitude RF signals by power amplifiers is performed when the output power is high, while a modulated RF signal with varying amplitude is directly amplified when the output power is low, instead of performing outphasing operation.

In another perspective, realizing a multiband scheme is one of important issues of wireless communication. As an example of multiband communication, Non-patent Literature 1 (NPL 1) discloses a Carrier Aggregation technology (hereafter referred to as a CA technology) which uses a plurality of fragmentary bands collected together. By thus combining the plurality of bands, the CA technology can preserve a broad bandwidth and also increase the transmission speed. For example, in an Inter-band Non-contiguous CA mode which uses carrier frequencies largely separated from each other, communication stability can be improved by performing simultaneous communications at a plurality of carrier frequencies having different propagation characteristics. If the CA technology can be employed, even when bands are allocated non-contiguously to a plurality of communication providers, or a plurality of communication providers share a band, it is possible to perform communications compatible with the respective cases.

CITATION LIST

Patent Literature

[PTL 1] Japanese Patent Application Laid-Open No. 2013-046352
[PTL 2] International Patent Publication No. WO 2008/093404

Non Patent Literature

[NPL 1] Nobuhiko Miki et al., "CA for Bandwidth Extension in LTE-Advanced", NTT DoCoMo Technical Journal (Japanese version), July, 2010, Vol. 18, No. 2, pp. 12-21, also in NTT DoCoMo Technical Journal (English version), Vol. 12, No. 2, pp. 10-19

SUMMARY OF INVENTION

Technical Problem

A general outphasing type PA has a narrow band characteristic and usually is compatible with only single-band operation. Therefore, to enable such an outphasing type PA to be employed in the CA technology, it is necessary to arrange the same number of power amplifiers as the number of bands to be used. Accordingly, when applying such outphasing type PA to a wireless communication system which uses large number bands, there is a problem of increase in the circuit size and in the cost. There is also a problem in that a wireless communication system employing the CA technology requires a transmission device for transmitting an RF signal of a plurality of bands, and even of such a transmission device, improvement in power efficiency is required.

In the method of disposing a phase adjuster at a preceding stage of a power amplifier, like that in PTL 1, the phase adjuster is required to have high accuracy. The method has also a problem in that a control signal of the phase adjuster needs to be synchronized with an RF signal inputted to the power amplifier, which causes difficulty in the control.

In the method of performing mode switching between modes for high and low output situations, like that in PTL 2, there arises a problem of decrease in power efficiency owing to that outphasing operation is not performed when the output is low.

The objective of the present invention is to provide a transmission device and a transmission method, both of which can realize a power-saving power amplifier compatible with Carrier Aggregation technology using a plurality of bands, while achieving improvement in both amplitude accuracy and power efficiency.

Solution to Problem

A transmission device of the present invention is a transmission device for transmitting an RF signal of a plurality of bands, the transmission device comprising: a modulation means that generates a first constant-envelope signal and a second constant-envelope signal from each of baseband signals set for respective ones of the plurality of bands, the first constant-envelope signal and the second constant-envelope signal having different phases; a power amplification means that amplifies each of the first constant-envelope signal and the second constant-envelope signal generated by the modulation means; and a combining means that combines the first constant-envelope signal and the second constant-envelope signal amplified by the power amplification means and generates an RF signal in which amplitude information contained in each of the baseband signals set for respective ones of the plurality of bands is restored.

A transmission method of the present invention is a transmission method for transmitting an RF signal of a plurality of bands, the transmission method comprising: generating a first constant-envelope signal and a second constant-envelope signal from each of baseband signals set for respective ones of the plurality of bands, the first constant-envelope signal and the second constant-envelope signal having different phases; amplifying each of the first constant-envelope signal and the second constant-envelope signal generated by the modulation means; and combining the first constant-envelope signal and the second constant-envelope signal amplified by the power amplification means and generates an RF signal in which amplitude information contained in each of the baseband signals set for respective ones of the plurality of bands is restored.

A transmission method of the present invention is a transmission method for transmitting an RF signal of a plurality of bands, the transmission method comprising: selecting an outphasing operation for a band which is equal to or higher than a preset determination criterion among the plurality of bands; and selecting a linear amplification operation for a band which is lower than the preset determination criterion among the plurality of bands, wherein the outphasing operation includes generating a first constant-envelope signal and a second constant-envelope signal from each of baseband signals set for respective ones of the plurality of bands, the first constant-envelope signal and the second constant-envelope signal having different phases, amplifying the first constant-envelope signal and the second constant-envelope signal generated for each of the selected bands, combining the first and second constant-envelope signals amplified for each of the selected bands, and generating an RF signal, in which amplitude information contained in the baseband signal corresponding to each of the selected bands is restored, according to a phase difference between the first constant-envelope signal and the second constant-envelope signal for the band; and the linear amplification operation includes generating a quadrature-modulated signal that is an RF signal obtained by imposing a baseband signal corresponding to the band on a carrier wave of the band for each of the selected bands, amplifying the quadrature-modulated signal generated for each of the selected bands, combining the amplified quadrature-modulated signals for respective ones of the selected bands, and generating an RF signal, in which amplitude information contained in the baseband signal corresponding to each of the selected bands is restored according to the quadrature-modulated signal generated for the band.

Advantageous Effects of Invention

According to the transmission device of the present invention, a power-saving power amplifier compatible with the Carrier Aggregation technology using a plurality of bands, with a small size and a low cost, while achieving improvement in both amplitude accuracy and power efficiency.

DESCRIPTION OF EMBODIMENTS

Figure 1:
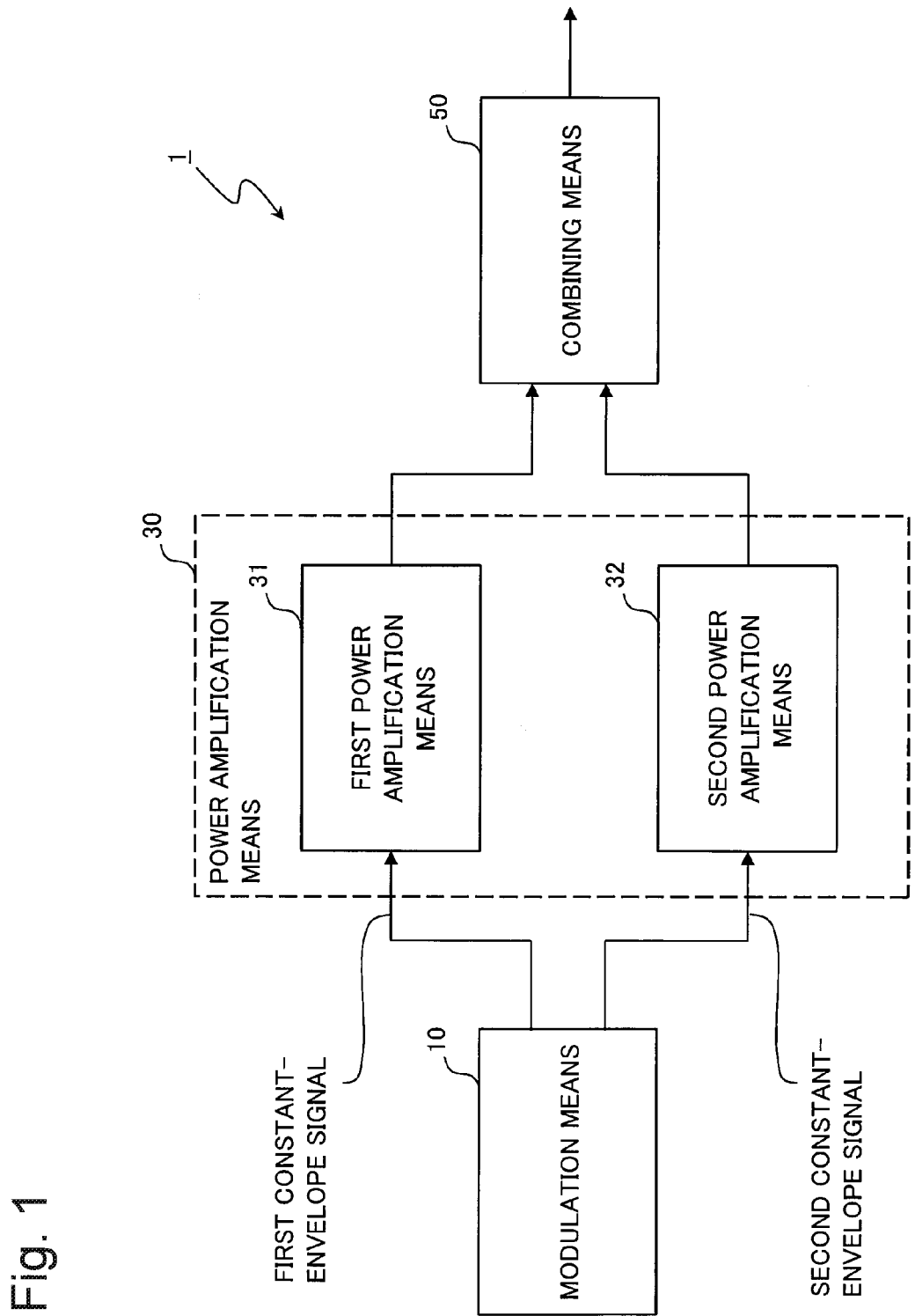
FIG. 1 a block diagram showing a functional configuration of a transmission device according to an outline of the present invention FIG. 2 a block diagram showing an internal configuration of a modulation means of the transmission device according to the outline of the present invention FIG. 3 a block diagram showing another internal configuration of the modulation means of the transmission device according to the outline of the present invention FIG. 4 a block diagram showing a functional configuration of a transmission device according to a first exemplary embodiment of the present invention FIG. 5 a conceptual diagram showing an example of signal waveforms processed by the transmission device according to the first exemplary embodiment of the present invention FIG. 6 a circuit configuration diagram showing an example of an internal configuration of a combiner in a transmission device comprising an outphasing type power amplifier according to a related technology FIG. 7 a circuit configuration diagram showing an example of an internal configuration of a combiner in the transmission device according to the first exemplary embodiment of the present invention FIG. 8 a circuit configuration diagram showing an example of an internal configuration of a transmission line inside the combiner according to the first exemplary embodiment of the present invention FIG. 9 a circuit configuration diagram showing an example of an internal configuration of a reactance circuit inside the combiner according to the first exemplary embodiment of the present invention FIG. 10 a circuit configuration diagram showing an example of an internal configuration of a reactance circuit inside the combiner according to the first exemplary embodiment of the present invention FIG. 11 a circuit configuration diagram showing an example of an internal configuration of the combiner in the transmission device according to the first exemplary embodiment of the present invention FIG. 12 a circuit configuration diagram showing an example of an internal configuration of the combiner in the transmission device according to the first exemplary embodiment of the present invention FIG. 13 a circuit configuration diagram showing an example of an internal configuration of the combiner in the transmission device according to the first exemplary embodiment of the present invention FIG. 14 a block diagram showing a functional configuration of a transmission device according to a second exemplary embodiment and a third exemplary embodiment of the present invention FIG. 15 a conceptual diagram showing an example of signal waveforms processed by the transmission device according to the second and third exemplary embodiments of the present invention FIG. 16 a block configuration diagram of a transmission device comprising an outphasing type power amplifier according to a related technology FIG. 17 a characteristics diagram showing a relationship between output power and power efficiency, for the transmission device according to the related technology FIG. 18 a characteristics diagram showing a relationship between output power and power efficiency, for the transmission device according to the third exemplary embodiment of the present invention FIG. 19 a block diagram showing a functional configuration of a transmission device according to a fourth exemplary embodiment of the present invention FIG. 20 a block diagram showing a functional configuration of a transmission device according to the fourth exemplary embodiment of the present invention FIG. 21 a block diagram showing a functional configuration of a transmission device according to a fifth exemplary embodiment of the present invention FIG. 22 a block diagram showing a functional configuration of a transmission device according to the fifth exemplary embodiment of the present invention FIG. 23 a vector diagram showing a vector representing a baseband signal carried by an RF signal in the transmission device comprising an outphasing type power amplifier according to a related technology FIG. 24 a vector diagram showing a vector representing a baseband signal carried by an RF signal in the transmission device comprising an outphasing type power amplifier according to the related technology FIG. 25 a characteristics diagram showing a relationship between output signal amplitude and outphasing angle in the transmission device comprising an outphasing type power amplifier according to the related technology

Hereinafter, exemplary embodiments of the present invention will be described with reference to drawings. In the exemplary embodiments described below, some number of restrictions which are technologically preferable for implementing the present invention will be made, but they shall not limit the scope of the present invention to that of the following descriptions.

In the drawings given below, identical or equivalent components will be given the same sign, and their descriptions may be occasionally omitted to avoid duplication. In the following descriptions, N used in the drawings represents an integer equal to or larger than 2. Components having the same function will be numbered by adding a number (including N) at the last end of the same sign which is given to them, but the additional number at the last end of the sign may be occasionally omitted in the following descriptions.

(Outline of Invention)

Figure 2:
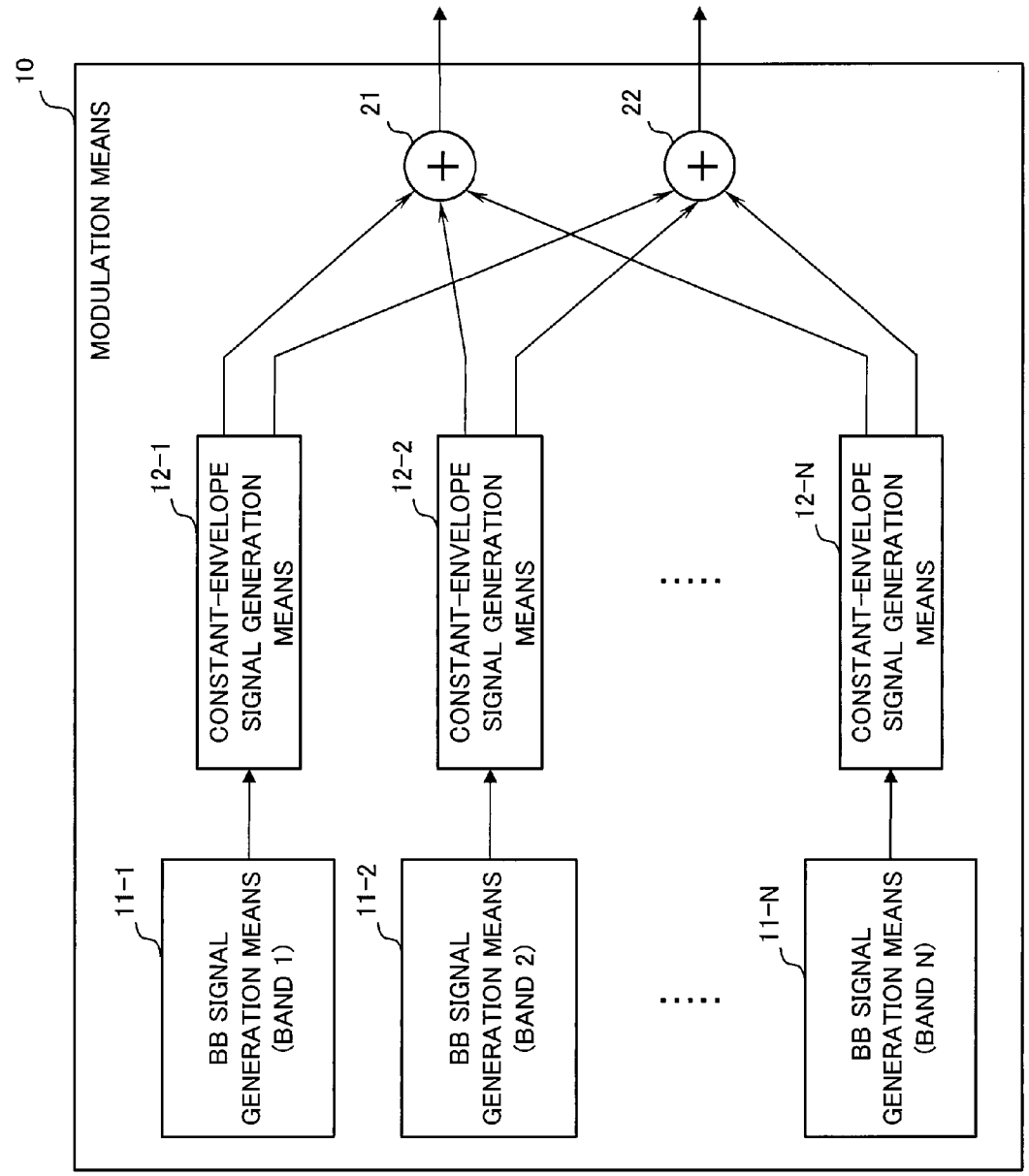
Figure 3:
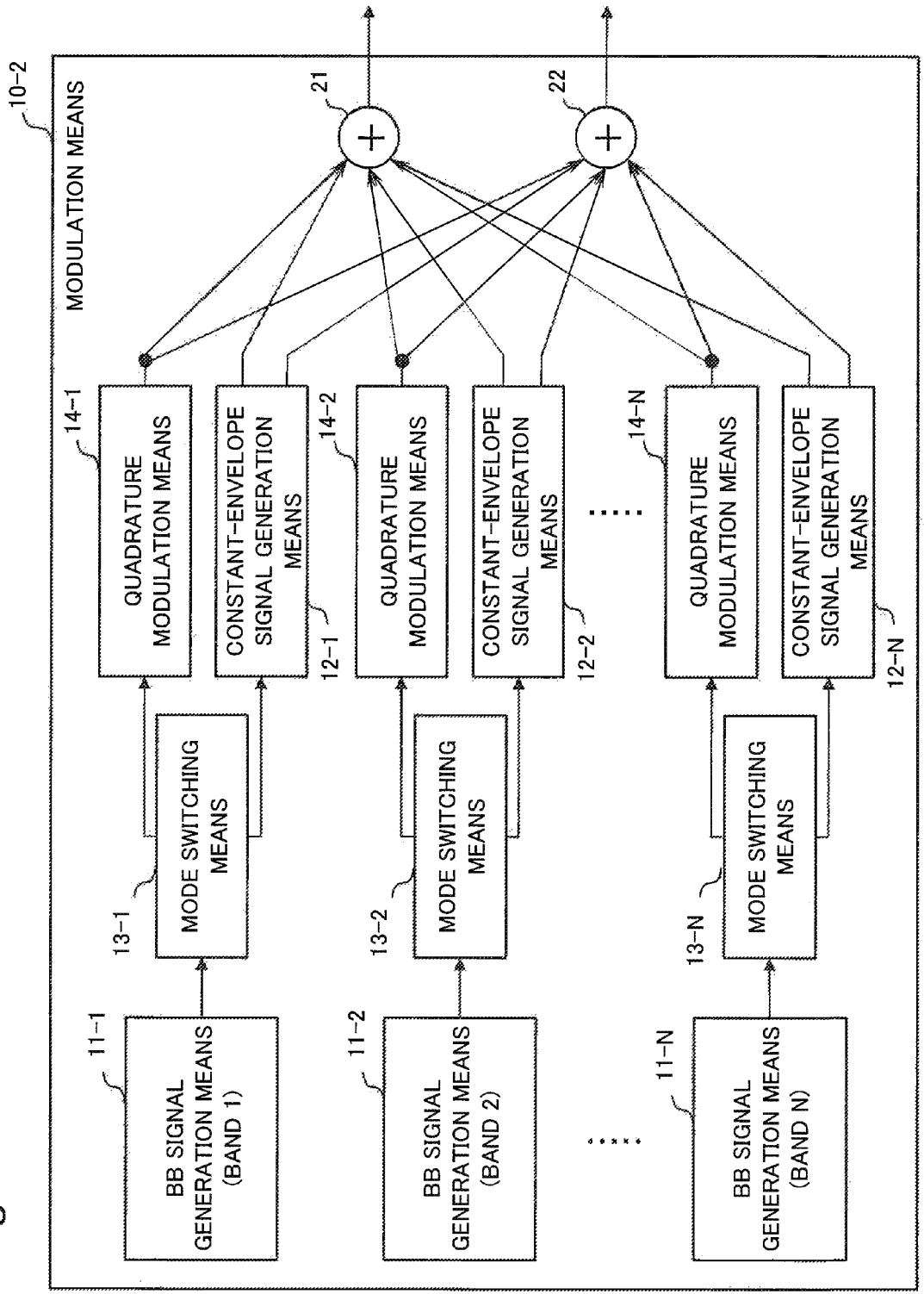

First, before describing the exemplary embodiments, an outline of the present invention will be described. FIGS. 1 to 3 show diagrams relating to the outline of the present invention.

A primary feature of the present invention is to realize a transmission device provided with a power amplification means which can simultaneously amplify signals of a plurality of frequencies generated by a modulation means (signal generator), thereby being compatible with CA (Carrier Aggregation) technology.

As shown in FIG. 1, a transmission device 1 of the present invention comprises a modulation means 10, a power amplification means 30 and a combining means 50. The power amplification means 30 includes a first and a second power amplification means 31 and 32.

As shown in FIG. 2, the modulation means 10 comprises a plurality of baseband signal generation means 11 (11-1 to 11-N), a plurality of constant-envelope signal generation means 12 (12-1 to 12-N) and two combiners 20 (a first combiner 21 and a second combiner 22). Here, a baseband signal is also referred to as a BB signal.

Each baseband signal generation means 11-i (i=1 to N) outputs a baseband signal to be imposed on an RF signal of the band i, to the constant-envelope signal generation means 12-i.

On the basis of the baseband signal of the band i generated by the baseband signal generation means 11-i, the constant-envelope signal generation means 12-i generates a first and a second constant-envelope signals, which are two constant-amplitude RF signals. The first and second constant-envelope signals are generated to have respective phases differently shifted from that of the baseband signal. In the present exemplary embodiment, the phase of the first constant-envelope signal is advanced and that of the second constant-envelope signal is delayed, compared to the phase of the baseband signal.

A term "outphasing signal", which will be used hereafter, represents a subordinate concept of the constant-envelope signal. For constant-envelope signals, there is only a restriction of constant amplitude, but no restriction on their phases. In contrast, for outphasing signals, there is a restriction that their phases are determined by an equation 4, which will be described later, in addition to the restriction of constant amplitude. When the constant-envelope signals described above are determined to be outphasing signals, the first and second constant-envelope signals have the same phase difference (outphasing angle) with reference to the baseband signal. When the constant-envelope signals are determined to be other than outphasing signals, the first and second constant-envelope signals do not necessarily need to have the same phase difference with reference to the baseband signal.

The first constant-envelope signals of the respective bands are combined together by the first combiner 21 in the modulation means 10, and subsequently inputted to the first power amplification means 31. Similarly, the second constant-envelope signals of the respective bands are combined together by the second combiner 22 in the modulation means 10, and subsequently inputted to the second power amplification means 32.

The first constant-envelope signals thus amplified by the first power amplification means 31 and the second constant-envelope signals thus amplified by the second power amplification means 32 are combined together by the combining means 50 disposed at the output end of the power amplification means 30, and modulated RF signals of the respective bands are thereby restored. The modulated RF signals of the respective bands, thus restored, are then used as a transmission signal in the transmission.

Employing the above-described configuration and operation, it becomes possible to transmit an RF signal of a plurality of bands even with a small number of power amplification means, and also realize increasing the efficiency of the power amplification means by the outphasing operation. As a result, according to the present outline with the configuration of FIG. 2, it is possible to realize a small-size, low-cost and power-saving transmission device which also is compatible with multiband transmission. The outphasing operation in the present outline embodiment will be described in detail in later description of a first exemplary embodiment.

As shown in FIG. 3, the transmission device 1 of the present outline may further comprise, in the modulation means 10, a plurality of mode switching means 13 (13-1 to 13-N) and a plurality of quadrature modulation means 14 (14-1 to 14-N). In that case, each of the mode switching means 13 selects whether to process a baseband signal of the corresponding band by the constant-envelope signal generation means 12 or by the quadrature modulation means 14.

For each of the bands, when a baseband signal of the band is processed by the constant-envelope signal generation means 12, two constant-envelope signals are generated on the basis of the baseband signal. The two constant-envelope signals thus generated are amplified by respective one of the first power amplification means 31 and the second power amplification means 32, and are subsequently combined together by the combining means 50 disposed at the output ends of the first power amplification means 31 and the second power amplification means 32, and a modulated RF signal of the band is thereby restored.

When modulation with the baseband signal is performed by the quadrature modulation means 14, an RF signal (quadrature-modulated signal) carrying the baseband signal at a carrier frequency corresponding to the band is generated. The quadrature-modulated signal is amplified by both of the first power amplification means 31 and the second power amplification means 32, and is subsequently transmitted via the combining means 50 disposed at the output ends of the first power amplification means 31 and the second power amplification means 32.

The first power amplification means 31 and the second power amplification means 32 each amplify RF signals of a plurality of bands, each of which is in the form of either a constant-envelope signal or a quadrature-modulated signal.

For a band to be transmitted at a low output power, the mode switching means 13 selects processing by the quadrature modulation means 14, and it selects processing by the constant-envelope signal generation means 12 for a band to be transmitted at a high output power.

The transmission device according to the present outline with the configuration of FIG. 3 needs no phase adjustment means which adjusts the phases of RF signals inputted to the power amplification means, and accordingly provides an effect of simplifying its circuitry and no occurrence of amplitude error due to the phase adjustment means itself.

In the transmission device according to the present outline with the configuration of FIG. 3 performs linear operation on signals of low output bands and outphasing operation on those of the remaining high output bands. As a result, the power amplification means can be each operated always in a nearly saturated state, and accordingly, the power efficiency can be kept high. That is, the transmission device provides an effect of making it possible to achieve both keeping high power efficiency and suppressing amplitude error in low output power operation.

In the transmission device according to the present outline, RF signals of a plurality of carrier frequency bands are amplified in a simultaneous and parallel manner by the use of only a small number of power amplifiers, and increasing the efficiency of the power amplifiers is realized by means of outphasing operation. Thereby provided is an effect of making it possible to realize a small-size, low-cost transmission device with reduced power consumption which is compatible with multiband transmission.

Further, in the transmission device according to the present outline, among signals of the plurality of bands amplified in a simultaneous and parallel manner, outphasing operation is performed on signals of high output bands, and linear amplification operation is performed on those of low output bands. Thereby provided is an effect of making it possible to realize a transmission device which is easy to control and can have both high amplitude accuracy and high power efficiency.

(First Exemplary Embodiment)

Figure 4:
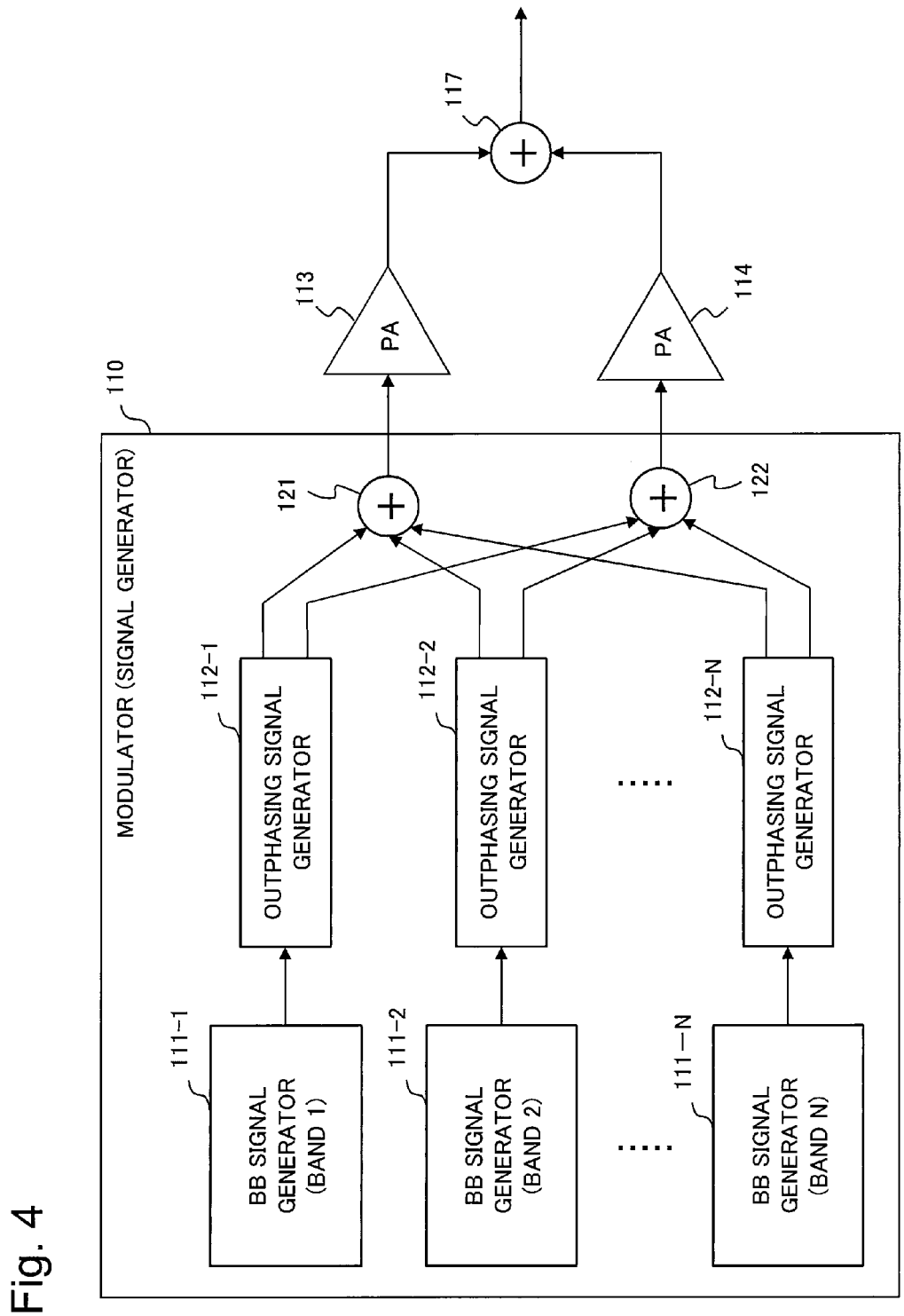
Figure 5:
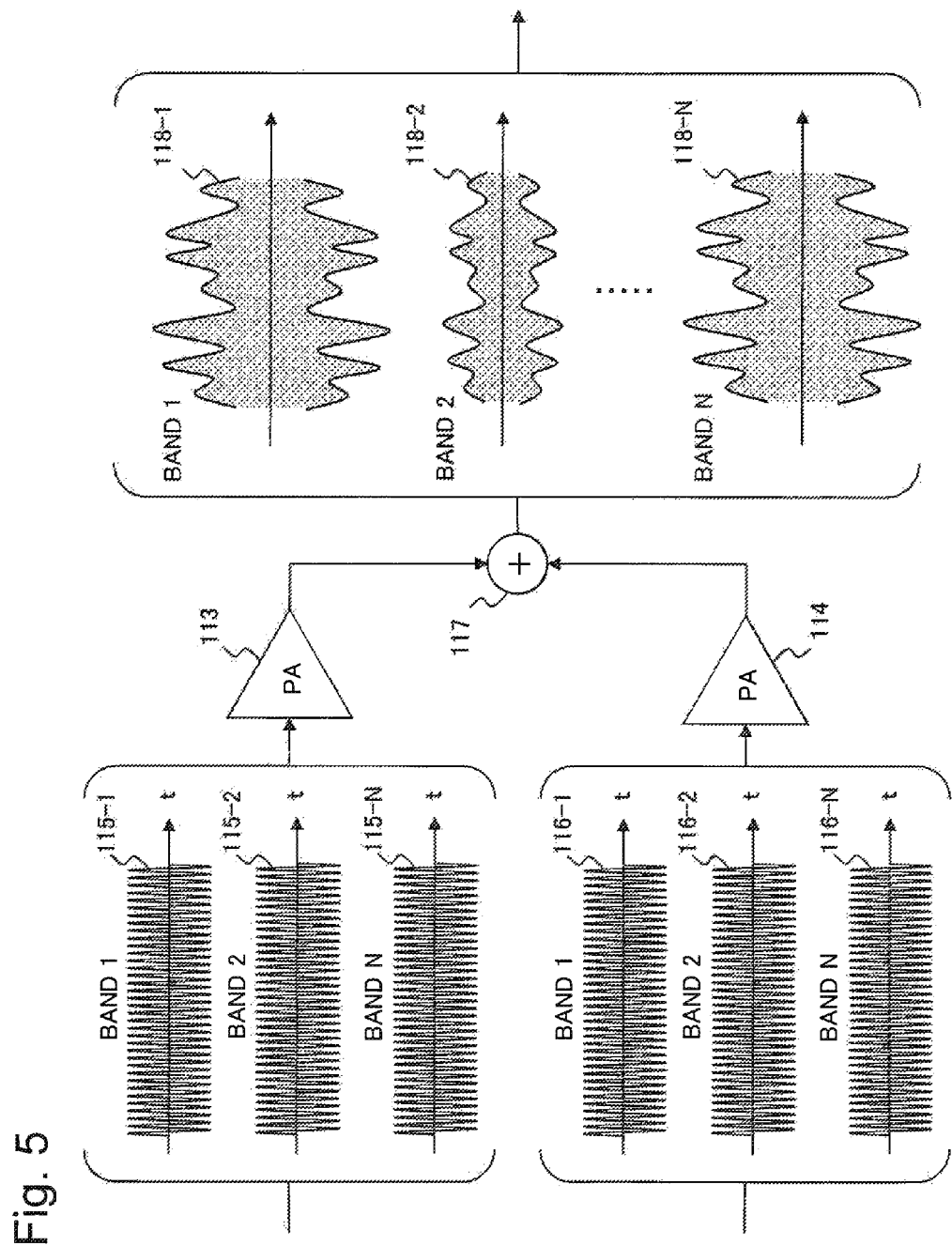

FIG. 4 is a block diagram showing a functional configuration of a transmission device according to a first exemplary embodiment of the present invention. FIG. 5 is a conceptual diagram showing an example of signal waveforms processed by the transmission device according to the first exemplary embodiment of the present invention.

The transmission device according to the first exemplary embodiment, shown in FIG. 4, comprises a modulator (signal generator) 110, two power amplifiers 113 and 114, and a combiner 117.

Further, the modulator 110 according to the present exemplary embodiment comprises a plurality of baseband signal generators 111 (111-1 to 111-N), a plurality of outphasing signal generators 112 (112-1 to 112-N) and two combiners 121 and 122. Here, N represents the number of bands used for transmission, and is an integer equal to or larger than 2.

In the transmission device shown in FIG. 4, the baseband signal generator 111-i (i=1 to N) outputs a baseband signal to be imposed on an RF signal of the band i, to the outphasing signal generator 112-i.

On the basis of the baseband signal generated by the baseband signal generator 111-i (i=1 to N), the outphasing signal generator 112-i generates two RF signals 115-i and 116-i each having a constant amplitude (constant envelope), as shown in FIG. 5. Here, the carrier frequency of both of the constant-amplitude RF signals 115-i and 116-i (i=1 to N) shown in FIG. 5 is set to be the carrier frequency $f_{ci}$ of the band i.

The constant-amplitude RF signals 115-1 to 115-N thus generated for the respective bands are combined together by the combiner 121, and subsequently inputted in a lump to the power amplifier 113. Similarly, the constant-amplitude RF signals 116-1 to 116-N generated for the respective bands are combined together by the combiner 122, and subsequently inputted in a lump to the power amplifier 114.

The constant-amplitude RF signals 115-1 to 115-N, which have been amplified by the power amplifier 113, and the constant-amplitude RF signals 116-1 to 116-N, which have been amplified by the power amplifier 114, are combined together by the combiner 117. As a result, a modulated RF signal 118-i (i=1 to N) is restored for each band i (FIG. 5). Thus restored modulated RF signals 118-1 to 118-N of the respective bands are transmitted as a transmission signal.

(Outphasing Operation)

Denoting, for each band i (i=1 to N), the modulated RF signal 118-i by $S_i(t)$, and the constant-amplitude RF signals 115-i and 116-i by $S_{ai}(t)$ and $S_{bi}(t)$, respectively, those signals are expressed respectively as in the following equations 1 to 3.

$$S_i(t)=A_i(t)\cos(2\pi f_{ci}t+\theta_i(t)) \quad (1)$$

$$S_{ai}(t)=G_i A_{max(i)} \cos(2\pi f_{ci}t+\theta_i(t)+\alpha_i(t)) \quad (2)$$

$$S_{bi}(t)=G_i A_{max(i)} \cos(2\pi f_{ci}t+\theta_i(t)-\alpha_i(t)) \quad (3)$$

For each band i in the present exemplary embodiment, the RF signal 115-i ($S_{ai}(t)$ of the equation 2) corresponding to the first constant-envelope signal is supplied to the combiner 121, and the RF signal 116-i ($S_{bi}(t)$ of the equation 3) corresponding to the second constant-envelope signal is supplied to the combiner 122.

Here, $A_i(t)$ and $\theta_i(t)$ are the amplitude and phase, respectively, of a baseband signal carried by the modulated RF signal 118-i in the band i, and they are each a function of time t.

$A_{max(i)}$ is the amplitude of both of the constant-amplitude RF signals 115-i and 116-i for the band i, and it has a constant value. $G_1$ is a gain of the power amplifiers 113 and 114 in the band i. $\alpha_i(t)$ is an outphasing angle of the constant-amplitude RF signals 115-i and 116-i for the band i.

The outphasing angle $\alpha_i(t)$ is set at a value given by the following equation 4, for each band.

$$\alpha_i(t)=\cos^{-1}[A_i(t)/G_i A_{max(i)}] \quad (4)$$

In this way, for each band, it becomes possible to set the amplitude of the modulated RF signal 118-i, which is obtained by combining the constant-amplitude RF signals 115-i and 116-i, to be equal to the amplitude of the baseband signal to be carried.

To achieve high power efficiency, it is desirable to operate the power amplifiers 113 and 114 in their saturated states, in the outphasing type PA.

The power amplifiers 113 and 114 amplify RF signals of the plurality of bands. The following equation 5 gives a condition for operating the power amplifiers 113 and 114 to amplify the plurality of bands in their saturated state.

$$[G_1 A_{max(1)}]^2+[G_2 A_{max(2)}]^2+\ldots+[G_N A_{max(N)}]^2=P_{sat} \quad (5)$$

Here, $P_{sat}$ has a constant value determined by the saturation powers of the power amplifiers 113 and 114. Accordingly, in the present exemplary embodiment, it is desirable to determine $A_{max(i)}$, which is the amplitude of both of the constant-amplitude RF signals 115-i and 116-i for the band i (i=1 to N), in a manner to satisfy the equation 5. As expressed by the equation 5, a value to be set for $A_{max(i)}$ (i=1 to N) is determined on the basis of the gain $G_1$ of the power amplifiers 113 and 114 in the band i and the constant value of $P_{sat}$ determined by their saturation powers.

(Combiner)

In the present exemplary embodiment, the combiner 117 is desired to have a multiband or broadband characteristic and a function of combining together the RF signals of the plurality of bands, 115-1 to 115-N and 116-1 to 116-N. An example of the combiner 117 having such a characteristic will be described below, comparing with a related technology.

Figure 6:
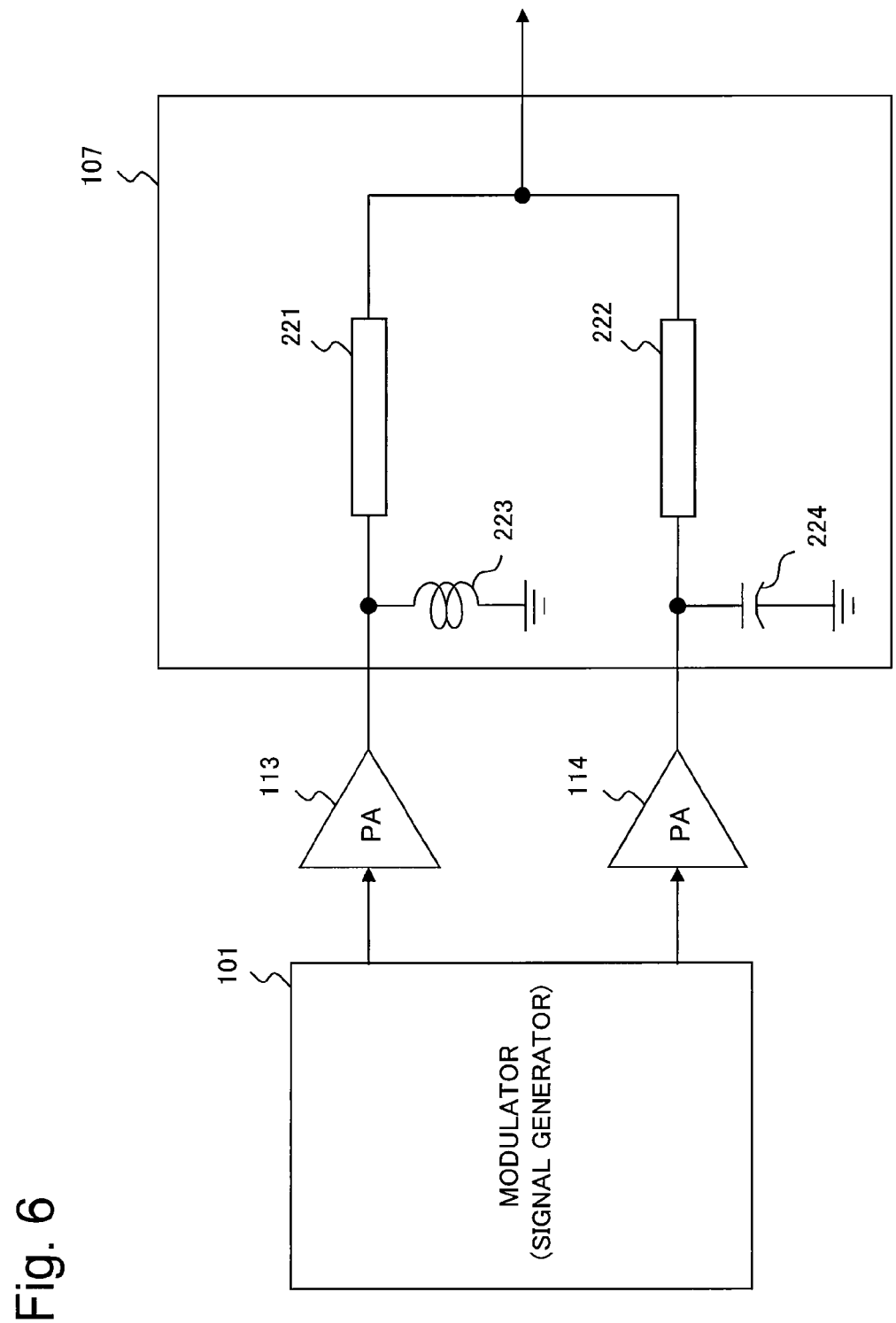

FIG. 6 shows an example of a circuit configuration ranging from a modulator (signal generator) 101 to a combiner 107 in an outphasing type PA according to a related technology. The combiner 107 of FIG. 6 according to the related technology is composed of λ/4 lines (¼ wavelength transmission lines) 221 and 222, an inductive element 223 and a capacitive element 224. Outputs of power amplifiers 113 and 114 are combined together via the λ/4 lines 221 or 222. In the example of FIG. 6, the inductive element 223 and the capacitive element 224 are added in order to keep the load impedance seen from the power amplifiers 113 and 114 at an optimum value even when the amplitude of a modulated RF signal (that is, its outphasing angle α) changes. Such a combining method which in that way keeps the load impedance seen from the power amplifiers at an optimum value is referred to as a Chireix combining.

Figure 7:
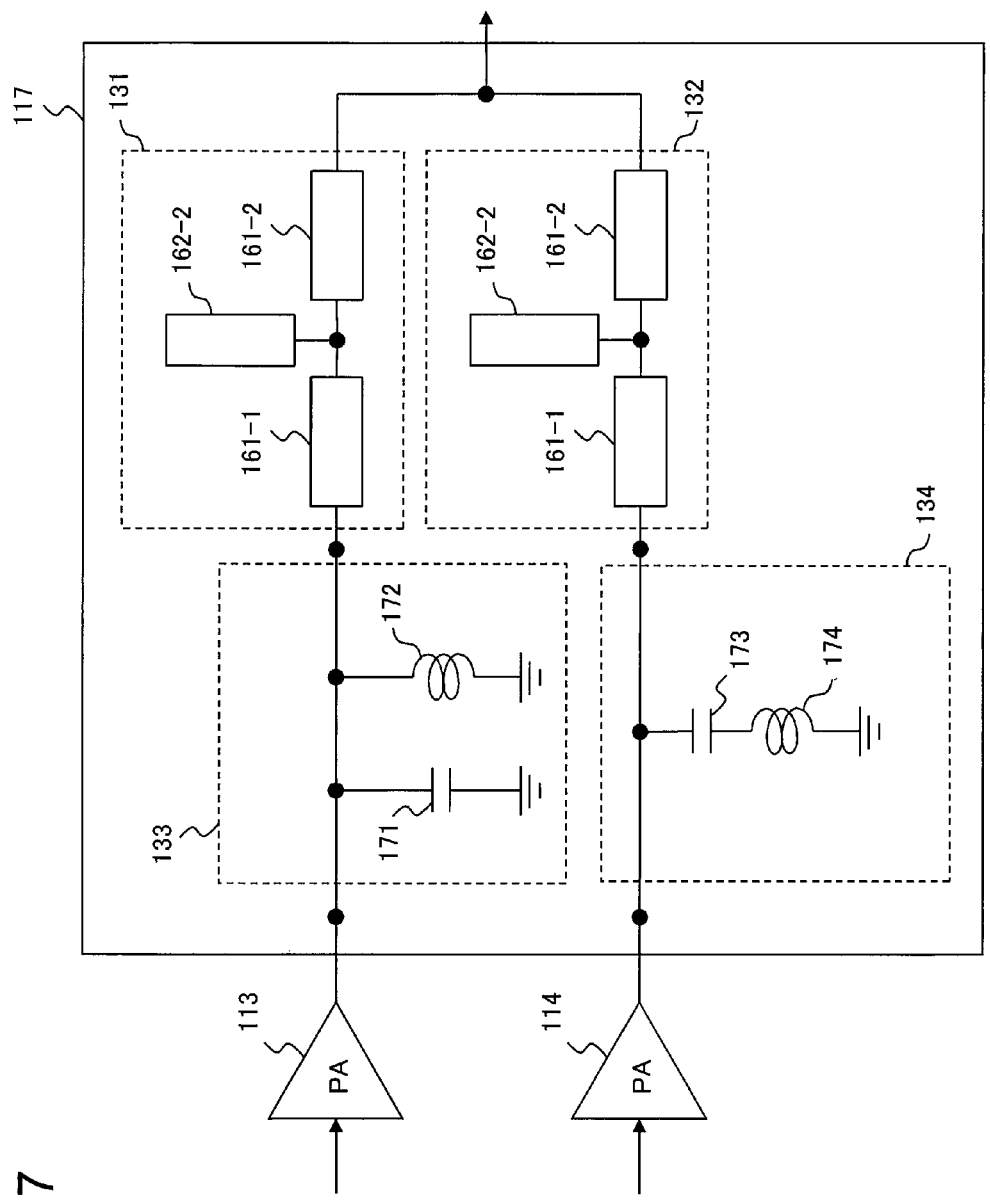

FIG. 7 is a circuit configuration diagram showing an example of an internal configuration of the combiner 117 according to the present exemplary embodiment. In the example shown in FIG. 7, the combiner 117 comprises transmission lines 131 and 132, and reactance circuits 133 and 134.

Transmission lines 131 and 132 in the combiner 117 shown in FIG. 7 correspond to the λ/4 lines 221 and 222 in the combiner 107 of the transmission device according to the related technology shown in FIG. 6. The λ/4 lines 221 and 222 in the combiner 107 of the related technology each have an electrical length of ¼ wavelength in only a single band.

In contrast, the transmission lines 131 and 132 in the combiner 117 of the present invention shown in FIG. 7 are each configured to have an electrical length of ¼ wavelength in each of a plurality of bands. By configuring each of the transmission lines 131 and 132 shown in FIG. 7 with three transmission lines (161-1, 161-2 and 162-2), it is possible to enable the transmission lines 131 and 132 to have an electrical length of ¼ wavelength in each of two bands.

The reactance circuits 133 and 134 in the combiner 117 shown in FIG. 7 correspond, respectively, to the inductive element 223 and the capacitive element 224 in the combiner 107 of the transmission device according to the related technology shown in FIG. 6.

A value of the inductive element 223 and that of the capacitive element 224, in the combiner 107 according to the related technology shown in FIG. 6, are designed to have respective reactance values required for the Chireix combining. Here, the inductive element 223 and the capacitive element 224 of the related technology can have such desired reactance values in only a single band.

In contrast, the reactance circuits 133 and 134 in the combiner 117 according to the present exemplary embodiment shown in FIG. 7 are designed to have respective reactance values required for the Chireix combining in a plurality of bands. The reactance circuits 133 and 134 shown in FIG. 7 are each composed of two reactance elements (the former composed of a capacitive element 171 and an inductive element 172, the latter composed of a capacitive element 173 and an inductive element 174). Accordingly, they can be designed to have desired reactance values in each of two bands. In the present exemplary embodiment, it is desirable that, with respect to two bands used for transmission, reactance values of the reactance circuits 133 and 134 are designed to have the same absolute value but opposite positive/negative signs.

The configuration of the combiner 117 shown in FIG. 7 is an example of a combiner for realizing a Chireix combining compatible with two bands. To realize a Chireix combining compatible with more than two bands, for example, the transmission lines 131 and 132 may be expanded as in FIG. 8, and the reactance circuits 133 and 134 as in FIGS. 9 and 10, respectively.

Figure 8:
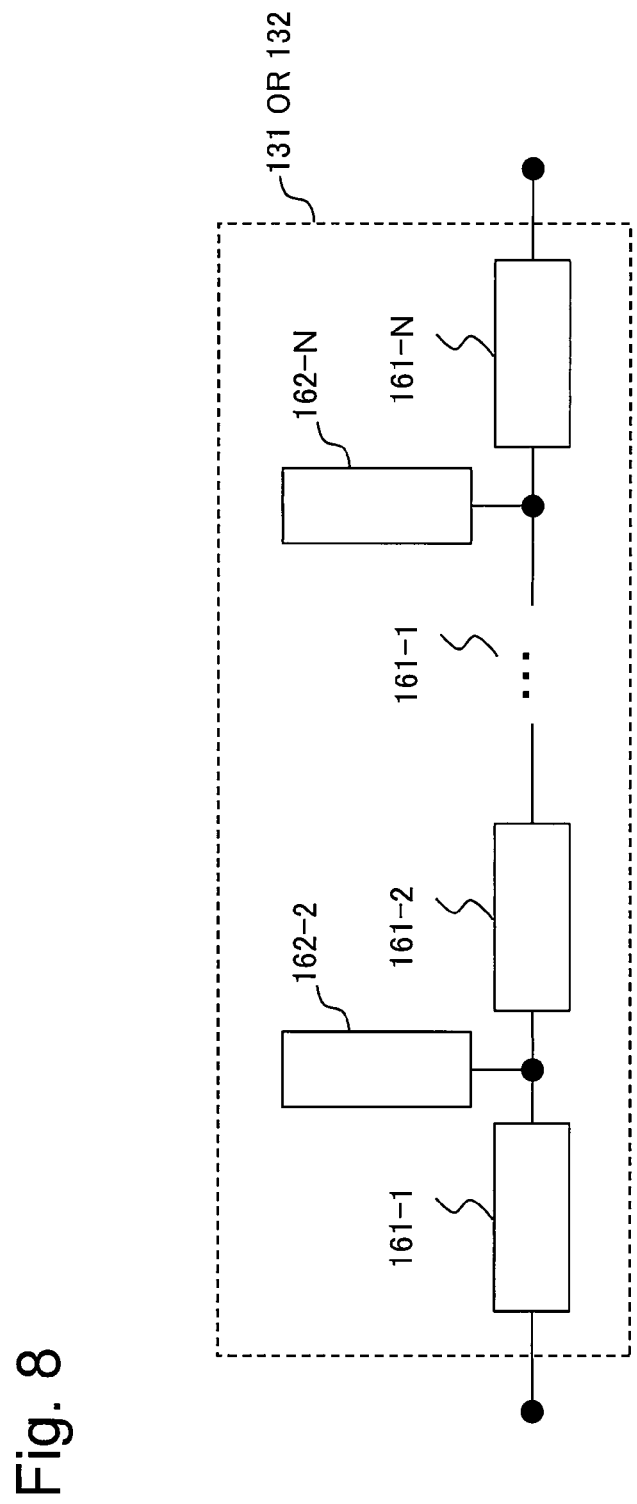

In FIG. 8, the transmission lines 131 and 132 are each composed of transmission lines 161-1 to 161-N and 162-2 to 162-N. The transmission lines 131 and 132 shown in FIG. 8 can be designed to have an electrical length of ¼ wavelength in a larger number of bands, by increasing the number of constituent transmission lines 161 and 162.

Figure 9:
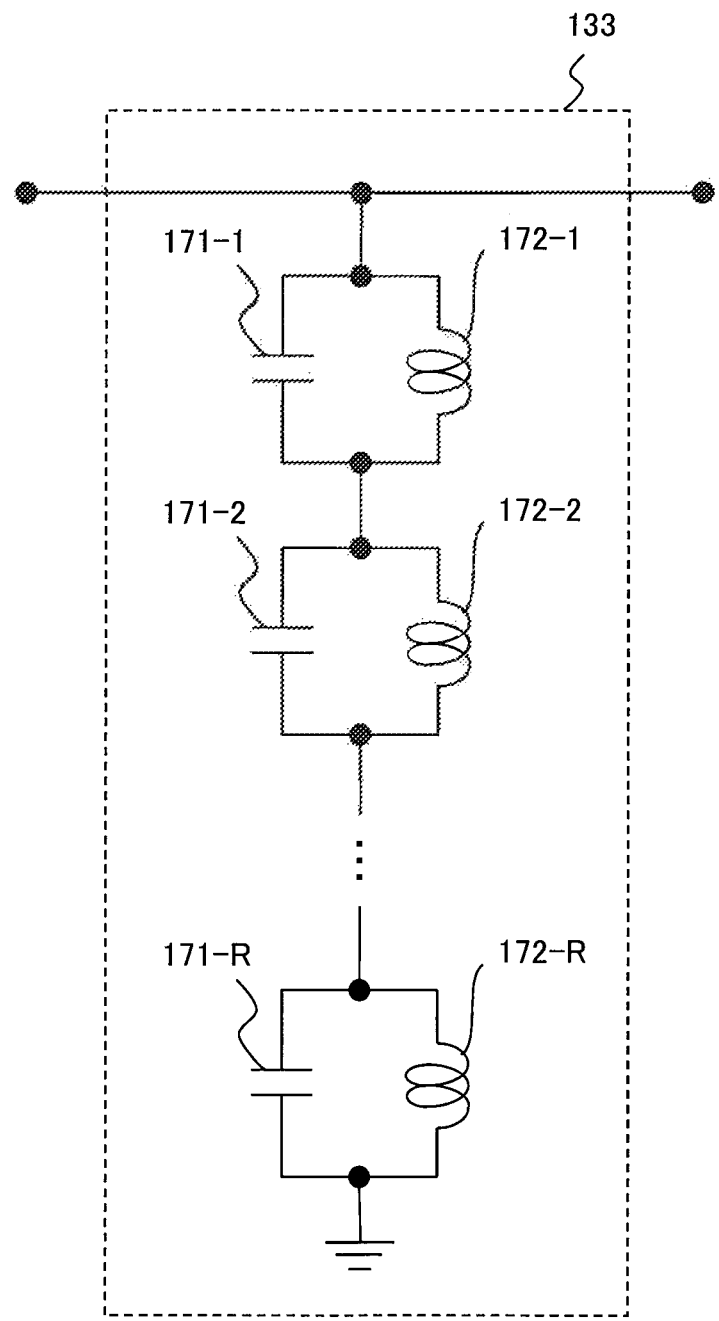
Figure 10:
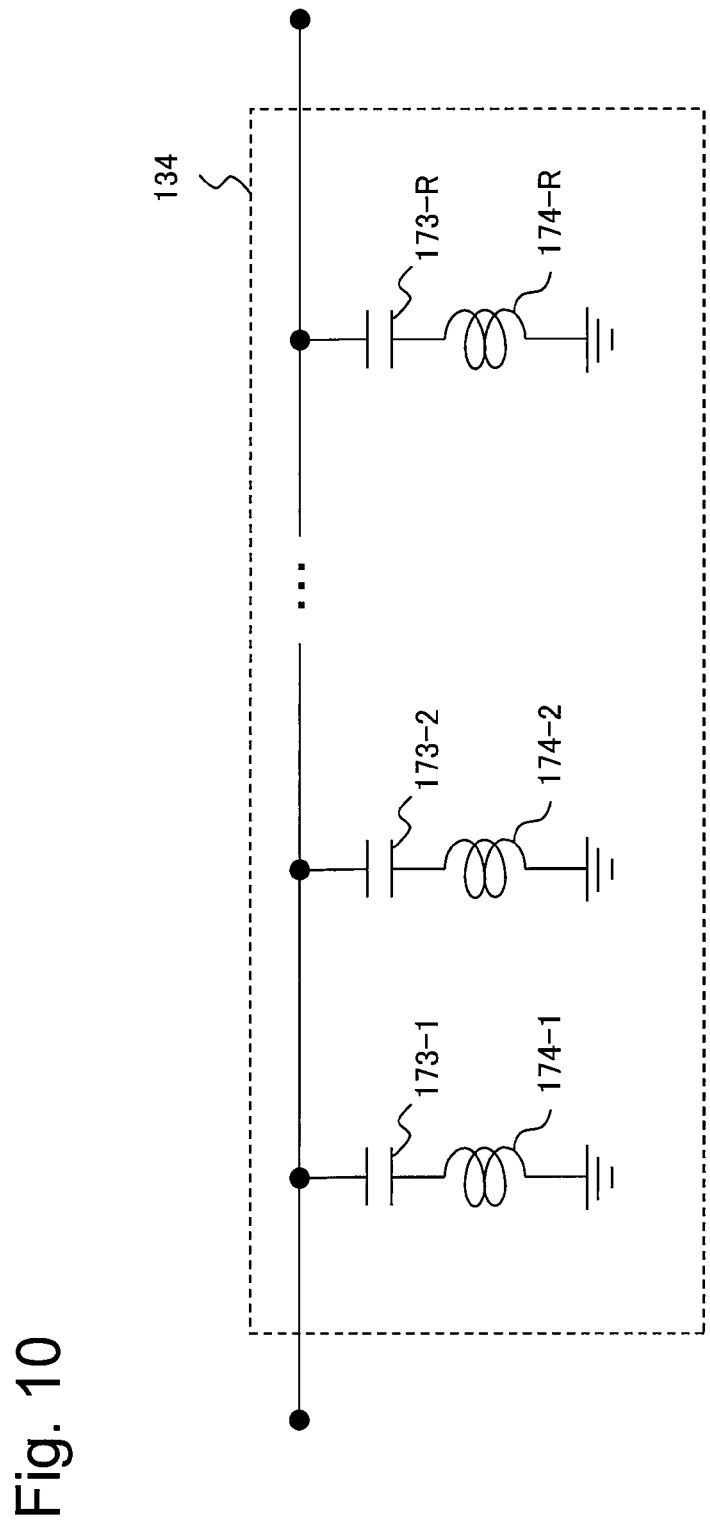

As shown in FIG. 9, the reactance circuit 133 is composed of capacitive elements 171-1 to 171-R and inductive elements 172-1 to 172-R. Similarly, as shown in FIG. 10, the reactance circuit 134 is composed of capacitive elements 173-1 to 173-R and inductive elements 174-1 to 174-R.

The reactance circuits 133 and 134 can be designed to have respective reactance values required for a Chireix combining compatible with a larger number of bands, by increasing the number of constituent capacitive and inductive elements. Specifically, when R, which is the number of capacitive elements and also that of inductive elements included in each of the reactance circuits 133 and 134, is equal to N/2, reactance values required for Chireix combining can be realized with respect to N-number of bands. In the present exemplary embodiment, it is desirable that, in a plurality of bands used for transmission, reactance values of the reactance circuits 133 and 134 are designed to have the same absolute value but opposite positive/negative signs.

When the Chireix combining of the related technology shown in FIG. 6 is used, the λ/4 lines in the combiner 107 cause the PA to have a narrow band characteristic. Accordingly, to enable the outphasing type PA of the related technology to be compatible with CA technology, it is necessary to comprise the same number of power amplifiers as the number of bands to be used.

In contrast, in the transmission device according to the present exemplary embodiment, the λ/4 lines in the combiner 117 can be changed according to the number of bands to be used. Accordingly, it becomes possible to make the PA's characteristic compatible with a broad band range. As a result, the number of power amplifiers does not need to be increased even when the number of bands to be used is increased, and accordingly, it becomes possible to realize a transmission device compatible with multiband transmission whose size, cost and power consumption are reduced.

(Modified Example)

Here, modified examples of the combiner 117 shown in FIG. 7 will be described, using FIGS. 11 to 13.

(Transformer)

Figure 11:
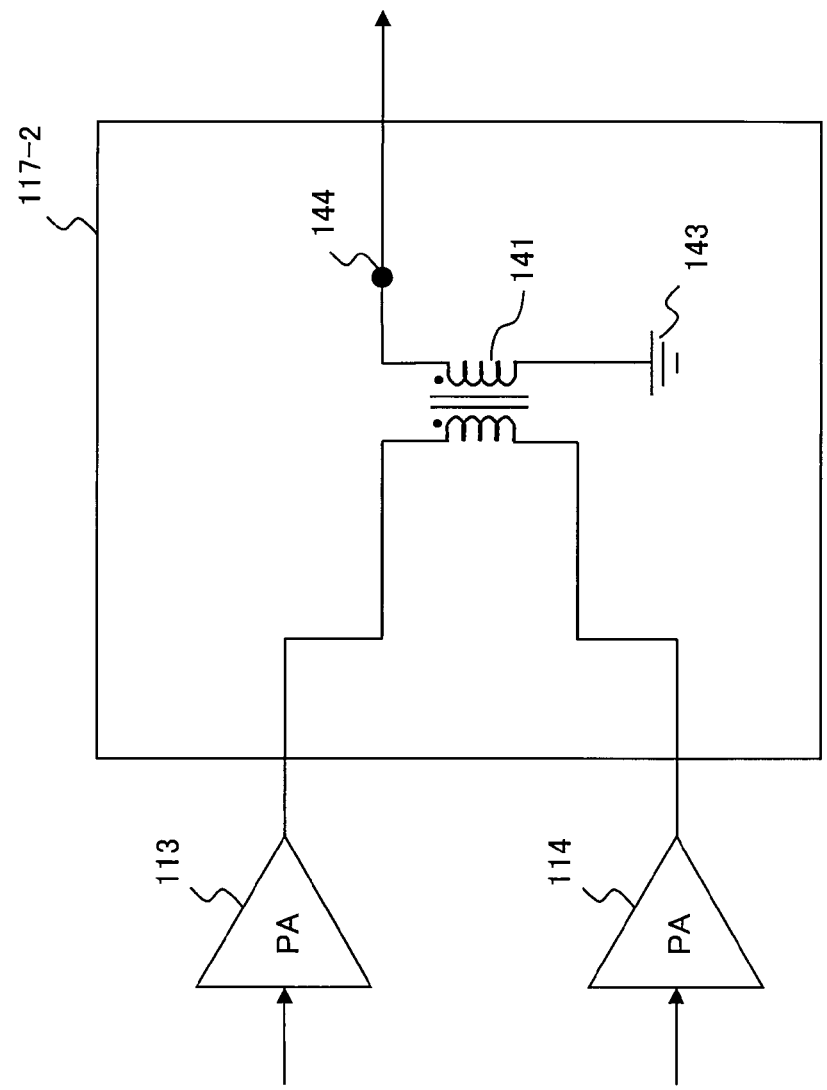
Figure 12:
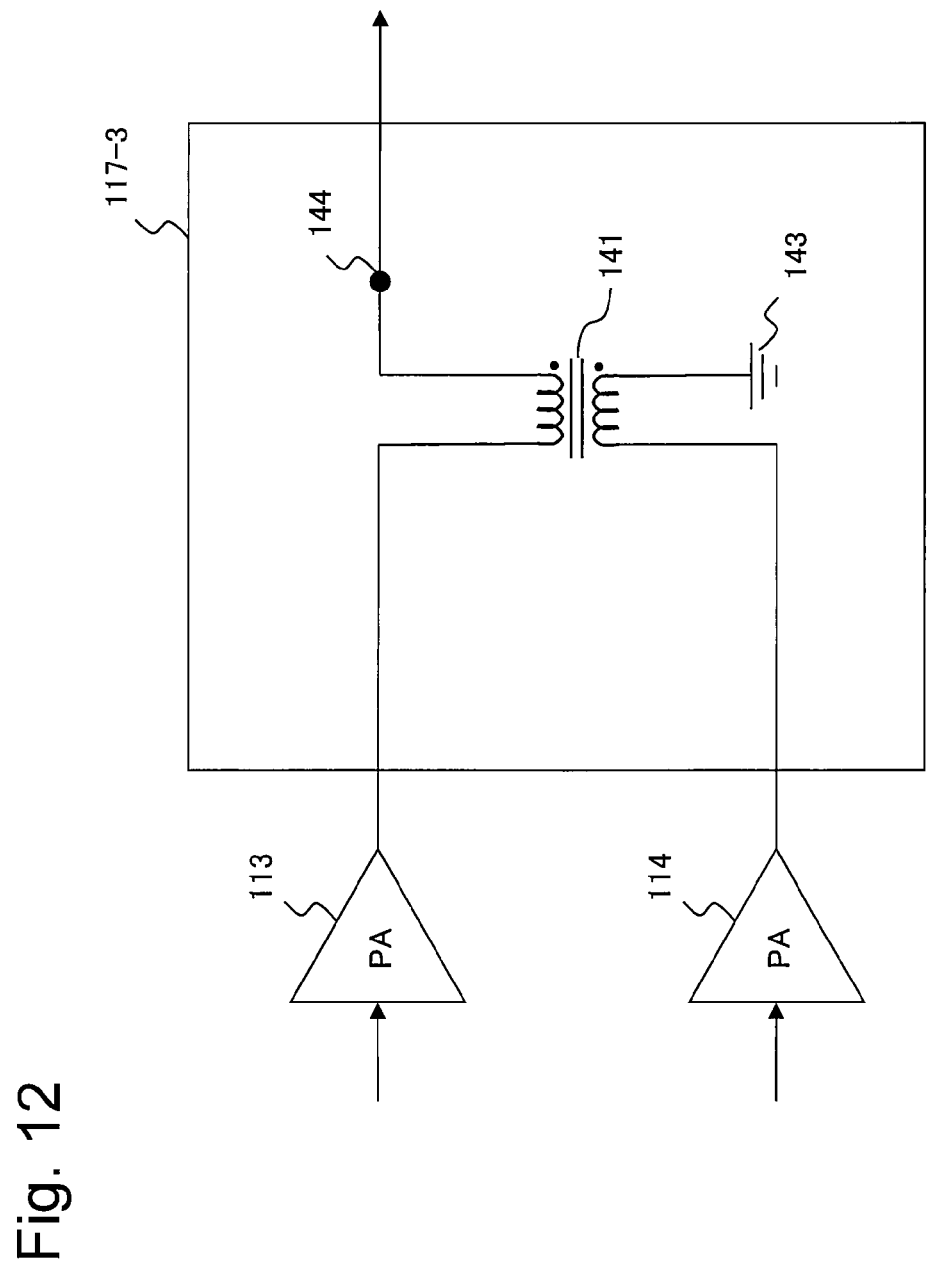

Combiners 117 (117-2 and 117-3) of respective ones of the modified examples, which are respectively shown in FIGS. 11 and 12, each perform combining by the use of a transformer 141.

In the combiner 117-2 of a modified example 1 shown in FIG. 11, the outputs of the respective power amplifiers 113 and 114 are connected to respective ones of two terminals of the primary winding of the transformer 141. To two terminals of the secondary winding of the transformer 141, a ground terminal 143 and an output terminal 144 of the combiner are connected, respectively.

In the combiner 117-3 of a modified example 2 shown in FIG. 12, the output of the power amplifier 113 is connected to one end of the primary winding of the transformer 141, and the output of the power amplifier 114 to one end of the secondary winding of the transformer 141. Then, the output terminal 144 is connected to the other end of the primary winding of the transformer 141, and an earth terminal 143 to the other end of the secondary winding of the transformer 141. The transformers 141 each have a broadband characteristic, and accordingly can combine together the RF signals of the plurality of bands, 115-1 to 115-N and 116-1 to 116-N.

Generally, a transformer has two terminals at each of its input side (primary winding) and output side (secondary winding), and accordingly has four terminals in total. In the present modified examples, the output terminals of the respective power amplifiers 113 and 114 are connected to different terminals of the transformer, and the remaining terminals of the transformer are connected to the output terminal of the transmission device and the ground terminal 143, respectively.

With the configurations of the combiners 117 (117-2 and 117-3) shown respectively in FIGS. 11 and 12, which are constituted by the respective transformers, it is possible to perform outphasing operation in a broad band range, and the load impedance seen from the power amplifiers is appropriately modulated according to the output power. When the RF signals of the plurality of bands, 115-1 to 115-N and 116-1 to 116-N, are amplified by the power amplifiers 113 and 114, each composed of only a single amplifier, modulation of the load impedance seen from the power amplifiers is performed separately for each frequency. Accordingly, using the combiners 117 shown respectively in FIGS. 11 and 12, high power efficiency can be obtained even in the case of amplifying the RF signals of the plurality of bands, 115-1 to 115-N and 116-1 to 116-N, by the power amplifiers 113 and 114, each composed of only a single amplifier.

(Transmission Line)

Figure 13:
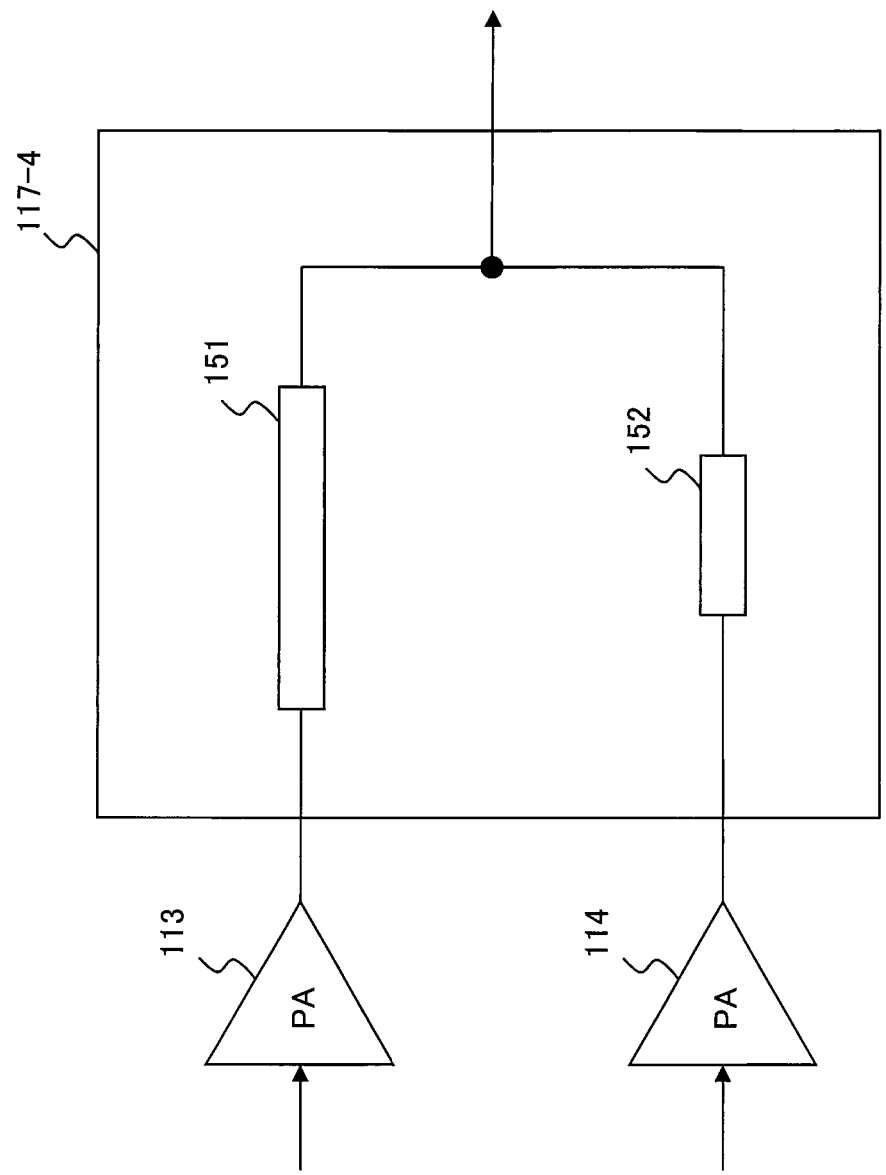

FIG. 13 shows an example of combining outputs of the power amplifiers 113 and 114 by the use of a combiner 117-4 composed of transmission lines 151 and 152 whose lengths are different from each other.

The configuration of the combiner 117-4 of FIG. 13 allows for performing outphasing operation, where the load impedance seen from the power amplifiers is appropriately modulated according to the output power. In the present modified example, the condition "the transmission lines 151 and 152 have different lengths from each other" is satisfied at any frequencies, and accordingly, the combiner 117-4 of FIG. 13 can be used in a broad band range. Accordingly, by the use of the combiner 117-4 of FIG. 13, outphasing operation can be performed even in the case of amplifying the RF signals of the plurality of bands, 115-1 to 115-N and 116-1 to 116-N, by the power amplifiers 113 and 114, each composed of only a single amplifier.

As already described above, modulation of the load impedance seen from the power amplifiers is performed separately for each frequency. Accordingly, by the use of the combiner 117-4 of FIG. 13, high power efficiency can be obtained even in the case of amplifying the RF signals of the plurality of bands, 115-1 to 115-N and 116-1 to 116-N, by the power amplifiers 113 and 114, each composed of only a single amplifier.

As has been described above, according to the first exemplary embodiment of the present invention, RF signals of a plurality of bands can be transmitted in a simultaneous and parallel manner by the use of the two power amplifiers 113 and 114, regardless of the number of bands used for the transmission. That is, in the present exemplary embodiment, there is no need of increasing the number of power amplifiers even when the number of bands used for transmission increases.

According to the present exemplary embodiment, the number of required power amplifiers can be reduced compared to the related technology requiring the same number of power amplifiers as the number of transmission bands. As a result, the present exemplary embodiment can provide an advantageous effect of enabling reduction in the cost and size of the transmission device. The effect of the present exemplary embodiment is more significant for a larger number of transmission bands. Therefore, the transmission device according to the present exemplary embodiment is desirable as a communication device compatible with CA technology.

(Second Exemplary Embodiment)

Figure 14:
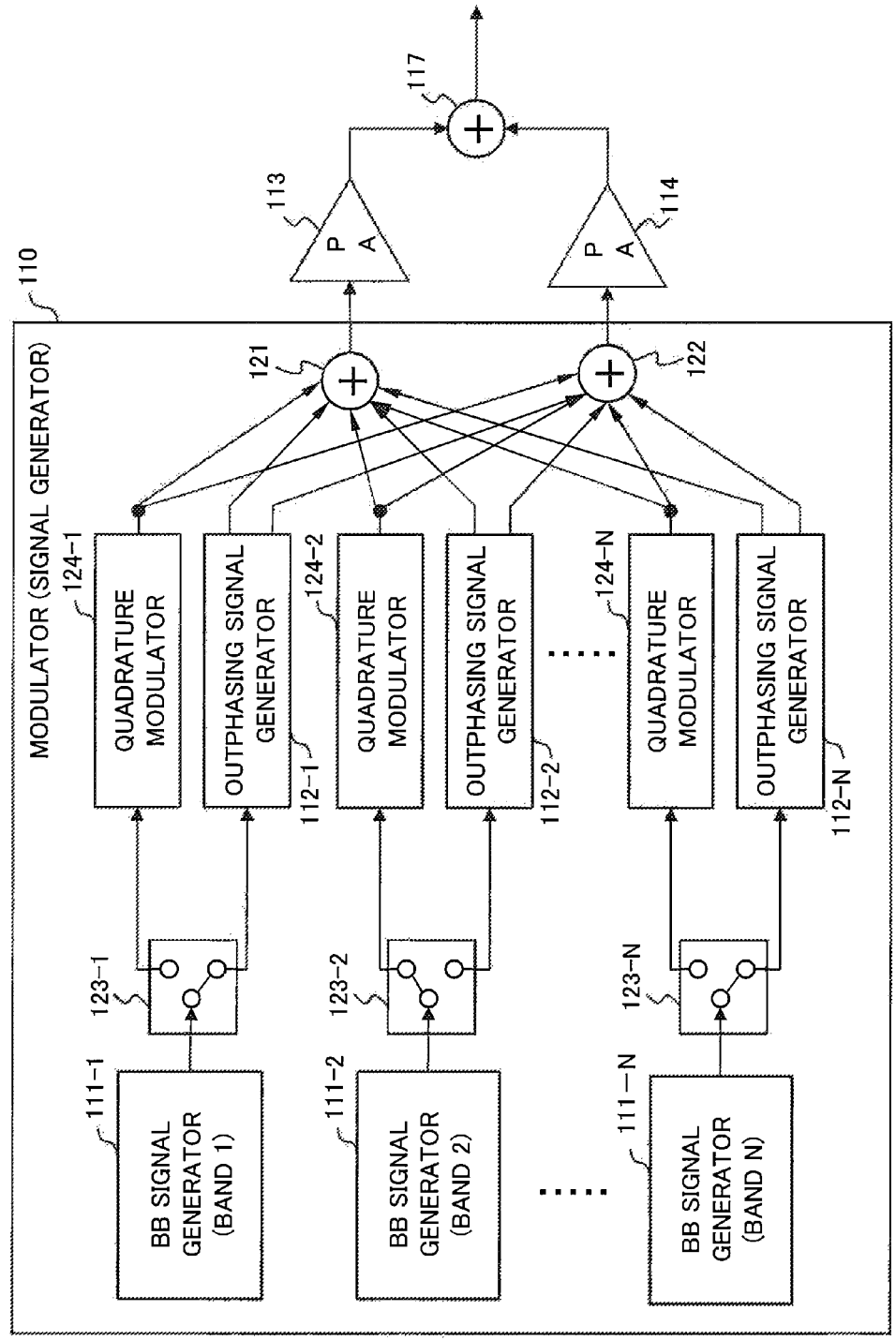
Figure 15:
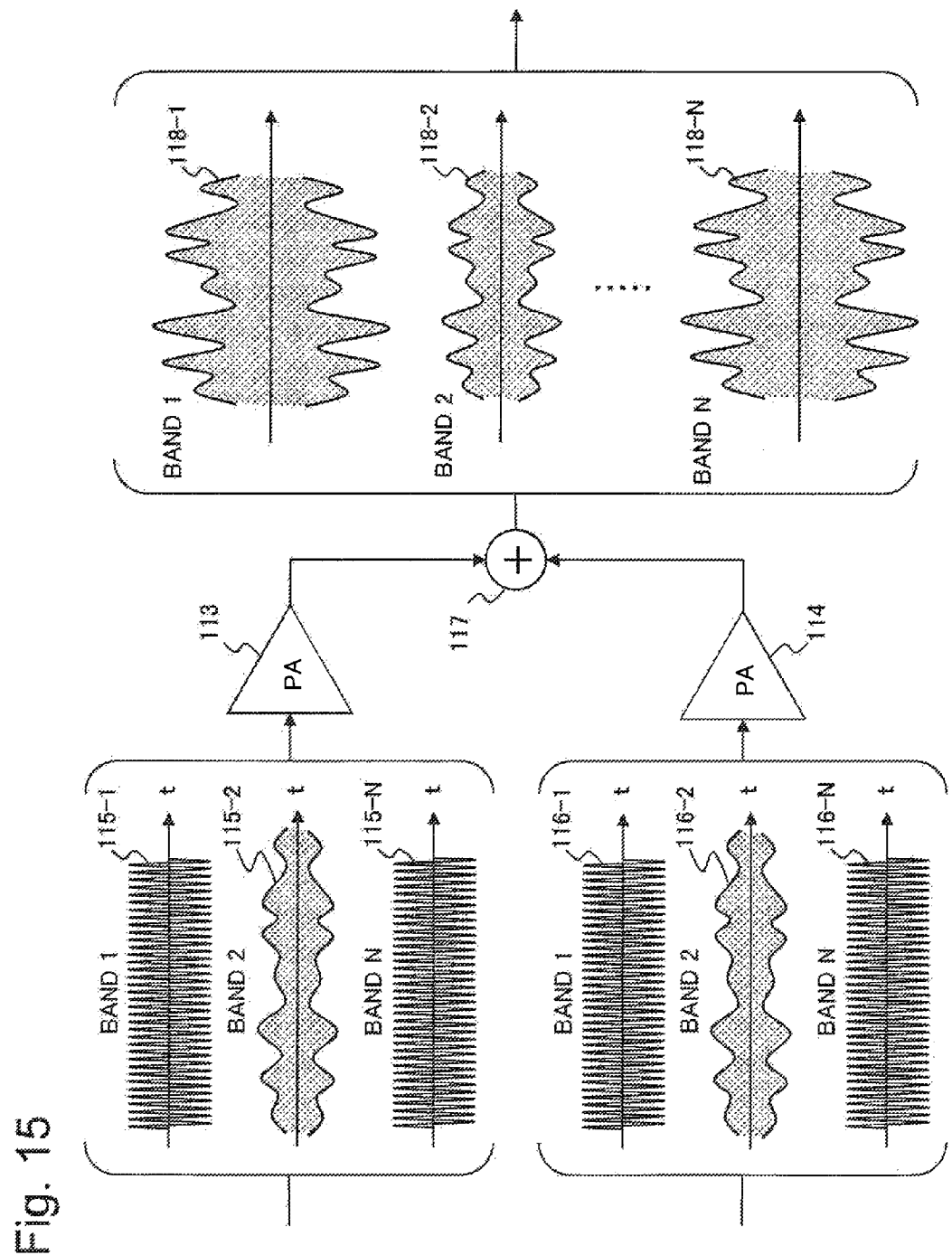

FIG. 14 is a block diagram showing a functional configuration of a transmission device according to a second exemplary embodiment of the present invention. FIG. 15 is a diagram for explaining a waveform transition of signals processed in the transmission device of FIG. 14 according to the second exemplary embodiment.

The transmission device according to the second exemplary embodiment shown in FIG. 14 is different from that of the first exemplary embodiment in that mode switching units 123 (123-1 to 123-N) and quadrature modulators 124 (124-1 to 124-N) are added inside the modulator (signal generator) 110. Except for the addition of the mode switching units 123 and the quadrature modulators 124, the configuration of the transmission device according to the second exemplary embodiment is the same as that of the transmission device according to the first exemplary embodiment.

Each mode switching unit 123-i (i=1 to N) performs switching in a manner to input an output signal of the corresponding baseband signal generator 111-i to either of the quadrature modulator 124-i and the outphasing signal generator 112-i. The diagram shown in FIG. 14 is the one showing an example of switching by the mode switching units 123, where outphasing operation is performed for the bands 1 and N, and linear amplification is performed on a modulated RF signal of the band 2. By operating a switch inside the mode switch 123-i, a signal from the baseband signal generator 111-i is inputted to either of the outphasing signal generator 112-i and the quadrature modulator 124-i.

The quadrature modulator 124-i outputs a modulated RF signal which is obtained by frequency-converting a baseband signal outputted from the baseband signal generator 111-i into a signal of the carrier frequency $f_{cm}$ of the band i. The quadrature modulator 124-i performs linear amplification operation, where the modulated RF signal with time-varying amplitude is directly amplitude, instead of performing outphasing operation. That is, the quadrature modulator 124-i performs modulation into a quadrature-modulated signal which is an RF signal corresponding to a carrier wave of the band i on which the baseband signal generated by the baseband signal generator 111-i is imposed.

In the second exemplary embodiment, as a result of the addition of the mode switching units 123 and the quadrature modulators 124, it is possible to select and then perform either of the outphasing operation and the linear amplification operation, for each band.

Here, additional descriptions will be separately given of the outphasing operation and the linear amplification operation, either of which is performed after the mode switching.

(Mode Switching: Outphasing Operation)

First, a description will be given of a case of performing outphasing operation for a certain band k. In that case, k is one of the integers 1, 2, ..., N, and is 1 or N in the example shown in FIGS. 14 and 15.

The mode switching unit 123-k handling the band k outputs a baseband signal outputted from the baseband signal generator 111-k for the band k, to the outphasing signal generator 112-k. The succeeding operations are the same as those in the first exemplary embodiment. That is, according to the transmission device according to the second exemplary embodiment, the outphasing signal generator 112-k generates two RF signals 115-k and 116-k for outphasing operation. As will be described later, in respect of making the power amplifiers 113 and 114 operate in their saturated states, the RF signals 115-k and 116-k are not necessarily required to have a constant amplitude.

The RF signals 115-k and 116-k for outphasing operation are inputted to the respective power amplifiers 113 and 114 via the respective combiners 121 and 122. After amplified by the respective power amplifiers 113 and 114, the RF signals 115-k and 116-k are combined together by the combiner 117, by which the modulated RF signal 118-k of the band k is restored.

(Mode Switching: Linear Amplification Operation)

Next, a description will be given of a case of performing linear amplification operation on a modulated RF signal in a certain band m. In that case, m is one of the integers 1, 2, ..., N, and is 2 in the example shown in FIGS. 14 and 15. The mode switching unit 123-m handling the band m outputs a baseband signal outputted from the baseband signal generator 111-m for the band m, to the quadrature modulator 124-m.

The quadrature modulator 124-m outputs a modulated RF signal which is obtained by frequency-converting a baseband signal outputted from the baseband signal generator 111-m into a signal of the carrier frequency $f_{cm}$ of the band m.

The modulated RF signal outputted from the quadrature modulator 124-m is inputted to both of the power amplifiers 113 and 114 via both of the combiners 121 and 122. Modulated RF signals 115-m and 116-m thus inputted to the respective power amplifiers 113 or 114 are the same as each other.

After amplified by the respective power amplifiers 113 and 114, the modulated RF signals outputted from the quadrature modulator 124-m are outputted via the combiner 117 as the modulated RF signal 118-m of the band m. The modulated RF signals 115-m and 116-m outputted from the quadrature modulator 124-m are each in a linear relationship with the modulated RF signal 118-m of the band m.

(Selection Criterion of Mode Switching)

As described above, in the second exemplary embodiment of the present invention, switching between the outphasing operation and the linear amplification operation is performed for each band. For example, on the basis of a determination criterion (threshold value) which is set as described below, the mode switching unit 123 performs switching between the outphasing operation and the linear amplification operation. Here, the following determination criteria (threshold values) are just examples, and it is not intended to limit the switching operation of the mode switching unit 123 to the following methods.

In a first example of a selection criterion of the operation, the number of bands for which outphasing operation is performed, denoted by Q, is determined in advance as a determination criterion (a threshold value for the number of bands). Then, outphasing operation is selected for Q-number of bands whose modulated RF signals 118 are to have the first to Q-th highest powers, respectively, and linear operation is selected for all of the remaining bands. That is, in the present example, the plurality of bands are ranked in descending order of modulated RF signal's power.

Each mode switching unit 123-i operates in a manner to output a baseband signal to the quadrature modulator 124-i when the band i is ranked at a place lower than that corresponding to the threshold value for the number of bands, and to the outphasing signal generator 112-i when the band i is ranked at a place equal to or higher than that corresponding to the threshold value.

In a second example of a selection criterion of the operation, a determination criterion (power threshold value) is set for each band. Then, the selection of operation is performed according to which is larger between the power of the modulated RF signal 118-i and the power threshold value, for the band i (i=1 to N). That is, outphasing operation is selected when the power of the modulated RF signal 118-i of the band i is equal to or larger than the predetermined power threshold value, and linear amplification operation is selected when the power of the modulated RF signal 118-i is smaller than the predetermined power threshold value. In the present example, the number of bands for which outphasing operation is performed, Q, varies depending on powers of the modulated RF signals 118-1 to 118-N.

(Operation)

Here, operation including the mode selection by the mode switching units 123 will be described.

It is assumed that outphasing operation is performed for bands of numbers B1, B2, . . . , BQ, and linear operation is performed for bands of numbers B(Q+1), . . . , BN (Q is an integer smaller than N). Also assumed is that the amplitude is $A_{in(i)}(t)$ for both of the RF signals 115-i and 116-i of the band i (i=B1, B2, . . . , BQ, B(Q+1), . . . , BN), which are inputted to the respective power amplifiers 113 or 114.

For each band m for which linear amplification operation is performed, the amplitude $A_{in(m)}(t)$ of the RF signals 115-m and 116-m, which are inputted to the respective power amplifiers 113 or 114, is determined by the amplitude of a baseband signal outputted from the baseband signal generator 111-m.

On the other hand, for each band k for which outphasing operation is performed, the amplitude $A_{in(k)}(t)$ of the RF signals 115-k and 116-k, which are inputted to the respective power amplifiers 113 or 114, is desired to be determined such that the power amplifiers 113 and 114 operate in their saturated states.

That is, it is desirable to set the amplitude $A_{in(k)}(t)$ of the RF signals 115-k and 116-k to satisfy the following equation 6.

$$[G_{B1}A_{in(B1)}(t)]^2 + [G_{B2}A_{in(B2)}(t)]^2 + \ldots + [G_{BQ}A_{in(BQ)}(t)]^2 + [G_{B(Q+1)}A_{in(B(Q+1))}(t)]^2 + \ldots + [G_{BN}A_{in(BN)}(t)]^2 = P_{sat} \quad (6)$$

For each band k for which outphasing operation is performed, the amplitude $A_k(t)$ of the modulated signal 118-k to be transmitted is determined to be proportional to the amplitude of a baseband signal outputted from the baseband signal generator 111-k, by controlling the outphasing angle $\alpha_k(t)$. Here, the outphasing angle $\alpha_k(t)$ is controlled according to the equations 1 to 4 already described in the first exemplary embodiment. Accordingly, as long as it satisfy the following equation 7, the amplitude $A_{in(k)}(t)$ of the RF signals 115-k and 116-k may be set independently of the amplitude of a baseband signal outputted from the baseband signal generator 111-k.

$$A_k(t) < G_k A_{in(k)}(t) \quad (7)$$

In the case of the present exemplary embodiment, the amplitude $A_{in(k)}(t)$ of the RF signal 115-k (116-k), for the band k, may be given a temporal variation with reference to that of the amplitude $A_{in(m)}(t)$ of the RF signal 115-m (116-m), for the band m, inputted to the power amplifier 113 (114). When giving such a temporal variation to the amplitude $A_{in(k)}(t)$ of the RF signal 115-k (116-k), for the band k, the variation is set in a manner to satisfy the saturated operation condition expressed by the equation 6.

According to the second exemplary embodiment of the present invention, there is provided an effect of enabling suppression of amplitude error in each band m of low output amplitude, by performing linear amplification operation for the band m instead of outphasing operation having a problem of amplitude error.

Also according to the second exemplary embodiment of the present invention, there is no need of a phase adjuster for adjusting the phases of RF signals inputted to the power amplifiers 113 and 114, differently from the related technology described in PTL 1 (Japanese Patent Application Laid-Open No. 2013-046352). As a result, there is provided an effect of simplifying the circuitry compared to the related technology of PTL 1 and no occurrence of amplitude error due to the phase adjuster itself.

The related technology described in PTL 2 (International Patent Publication No. WO 2008/093404) can suppress amplitude error in low output operation, by the use of a method of performing, for only a single band, outphasing operation in high output cases and linear amplification operation in low output cases. However, the related technology of PTL 2 has a problem of low power efficiency, which is caused by the method's not performing outphasing operation in low output cases.

In contrast, according to the second exemplary embodiment of the present invention, it becomes possible, in a method of amplifying RF signals of a plurality of bands by a single power amplifier, to perform outphasing operation for bands of high output, while performing linear amplification operation for bands of low output. As a result, the power amplifier can be operated always in its saturated state by satisfying the condition of the equation 6, and the power efficiency accordingly can be kept high. That is, the second exemplary embodiment of the present invention provides an effect of making it possible to achieve both suppressing amplitude error in low power cases and keeping high power efficiency, differently from the related technology of PTL 2.

The second exemplary embodiment of the present invention also provides, similarly to the first exemplary embodiment, an effect of enabling reduction in the number of required power amplifiers, particularly when the number of transmission bands is large, thereby enabling reduction in the cost and size of the transmission device, compared to the transmission devices according to the related technologies.

(Third Exemplary Embodiment)

A third exemplary embodiment is realized by a transmission device having the same configuration as that of the second exemplary embodiment shown in FIG. 14. The third exemplary embodiment is the same as the second exemplary embodiment also in performing linear amplification operation for each band m (m=B(Q+1), . . . , BN) of low output and outphasing operation for each band k (k=B1, B2, . . . , BQ) of high output.

The third exemplary embodiment is different from the second exemplary embodiment in that the RF signals 115-k and 116-k (k=B1, B2, . . . , BQ) for outphasing operation have constant amplitude. In the present case, the following equation 8 is used as a condition to be satisfied by the amplitude $A_{in}(k)$ of both of the RF signals 115-k and 116-k for outphasing operation, in place of the equation 6.

$$[G_{B1}A_{in(B1)}(t)]^2+[G_{B2}A_{in(B2)}(t)]^2+ \ldots +[G_{BQ}A_{in(BQ)}(t)]^2+[G_{B(Q+1)}\text{Max}[A_{in(B(Q+1))}(t)]]^2+ \ldots +[G_{BN}\text{Max}[A_{in(BN)}(t)]]^2=P_{sat} \quad (8)$$

Here, $\text{Max}[A_{in(B(m))}(t)]$ (m=B (Q+1), . . . , BN) is a maximum value of the amplitude $A_{in(B(m))}(t)$ of both of the RF signals 115-m and 116-m for each band m for which linear amplification operation is performed.

Under the condition of the equation 8, the power amplifiers 113 and 114 are not in their saturated operation unless, at the same time for every band m for which linear amplification operation is performed, the amplitude of the RF signals 115-m and 116-m is at the maximum.

However, when RF signals of a plurality of bands are amplified by a single power amplifier, the power efficiency is almost determined by the amplitude of the RF signals 115-k and 116-k for every band k of high output, for which outphasing operation is performed. The power efficiency is little affected by the amplitude of the RF signals 115-m and 116-m for every band m of low output, for which linear amplification operation is performed. Accordingly, even if the saturation condition of the equation 8 comes to be not completely satisfied as a result of setting a backoff for the RF signals 115-m and 116-m of each band m, for which linear amplification operation is performed, the power efficiency changes little from that in the state of completely satisfying the equation 8, and is accordingly kept high.

Thus, the same advantageous effect as that in the second exemplary embodiment can be achieved in the third exemplary embodiment.

Here, in order to more clearly show the effect of the third exemplary embodiment (in particular, realization of high power efficiency), a description will be given of power efficiency of the transmission device of the related technology based on PTL 2 (International Patent Publication No. WO 2008/093404) and that of the transmission device in the third exemplary embodiment of the present invention, using drawings.

Figure 16:
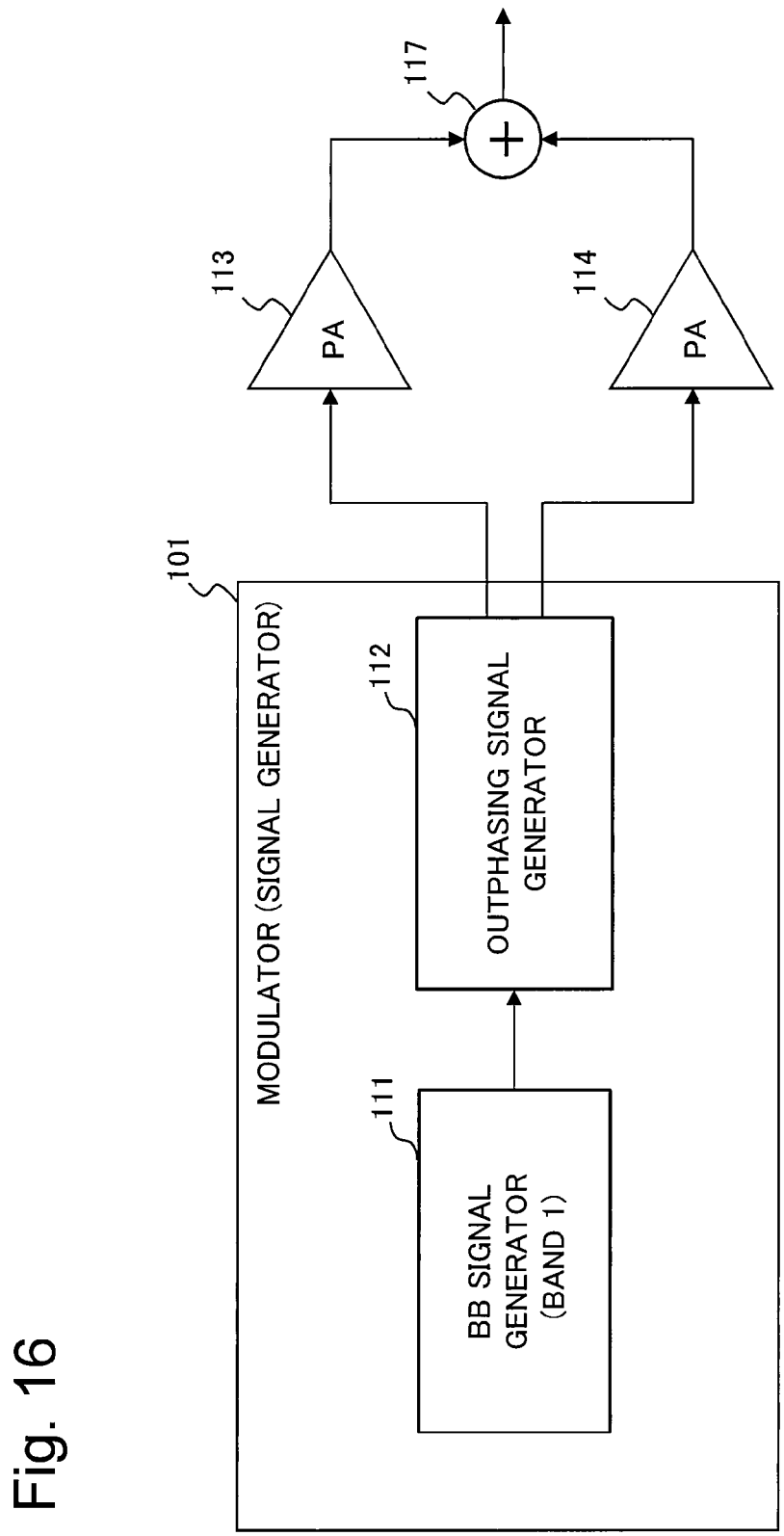

FIG. 16 is a configuration diagram of the transmission device according to the related technology (PTL 2) which uses outphasing technology. The transmission device of FIG. 16 is composed of a modulator 101 consisting of a baseband signal generator 111 and an outphasing signal generator 112, two power amplifiers 113 and 114 and a combiner 117. A detail description of the transmission device of FIG. 16 according to the related technology will be given later.

Figure 17:
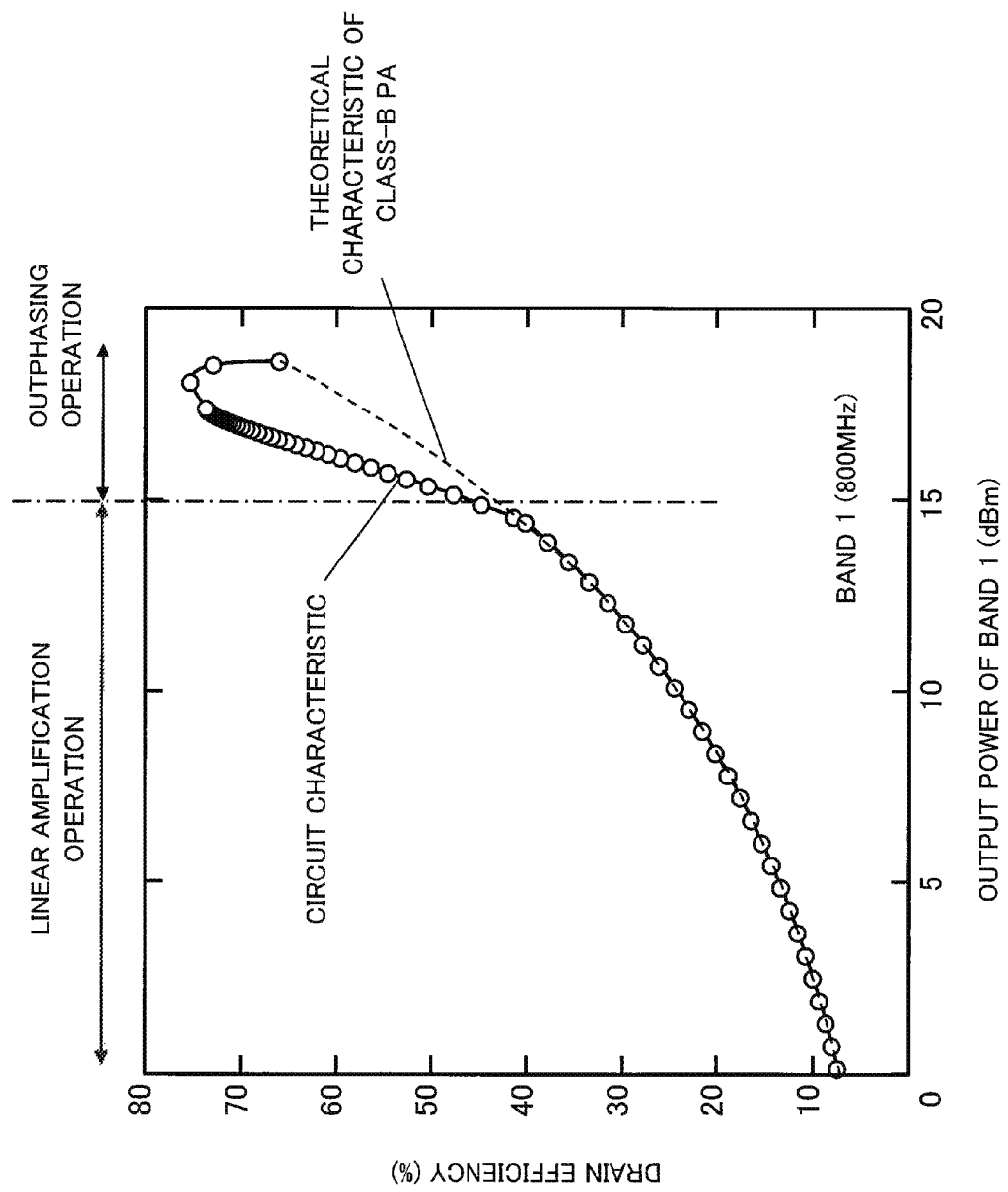

FIG. 17 shows power efficiency (drain efficiency) of the transmission device of the related technology shown in FIG. 16.

In the example of FIG. 17, the transmission device transmits RF signals of only a single band (800 MHz), where outphasing operation is performed when the power is high (equal to or higher than 15 dBm) and linear amplification operation is performed when the power is low (lower than 15 dBm). In FIG. 17, linear amplification operation is performed in the left region of the dashed-dotted line, and outphasing operation is performed in the right region.

As seen in FIG. 17, in the region of high output power (equal to or larger than 15 dBm) where outphasing operation is performed, the power efficiency is improved compared to theoretical values of power efficiency of the class-B PA. On the other hand, in the region of low output power (lower than 15 dBm) where linear amplification operation is performed, the power efficiency almost traces theoretical values for the class-B PA, and decreases with decreasing output power.

Figure 18:
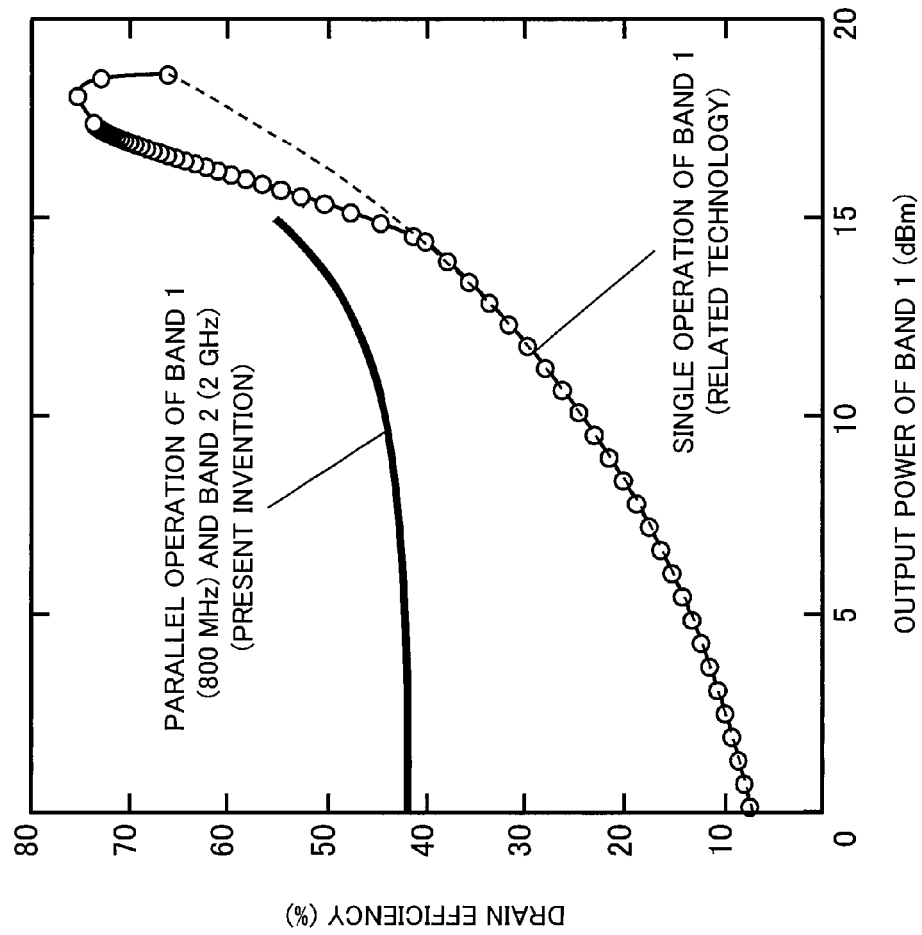

FIG. 18 shows power efficiency (drain efficiency) of the transmission device according to the third exemplary embodiment of the present invention. In FIG. 8, for comparison, the already-described power efficiency of the transmission device according to the related technology is plotted again, along with the power efficiency of the transmission device according to the third exemplary embodiment of the present invention.

Here, the transmission device according to the third exemplary embodiment of the present invention transmits RF signals of two bands (800 MHz and 2 GHz) in a simultaneous and parallel manner. There, outphasing operation is performed for the 2 GHz band (band 2), where output power is fixed at 16 dBm. On the other hand, linear amplification operation is performed for the 800 MHz band (band 1), where output power is swept with values indicated by the horizontal axis of the graph.

As seen in FIG. 18, in the transmission device according to the present exemplary embodiment, its power efficiency shows almost no decrease even when output power is decreased for the band 1 for which linear amplification operation is performed. This is because, as already described above, even when the operation for low output power is performed for one of the two bands, the power amplifiers 113 and 114 can be kept in their saturated or nearly-saturated states by performing the operation for high output power for the other band, and the power efficiency accordingly can be kept high.

(Fourth Exemplary Embodiment)

Figure 19:
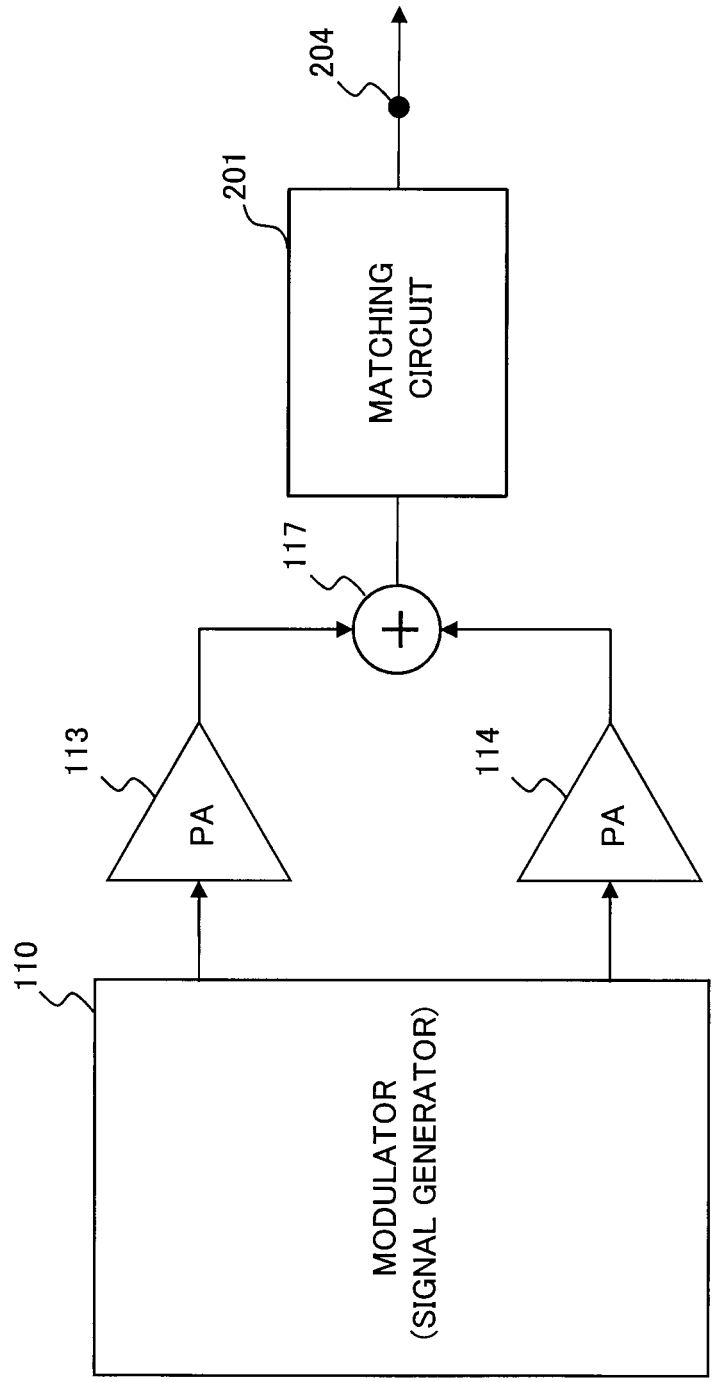
Figure 20:
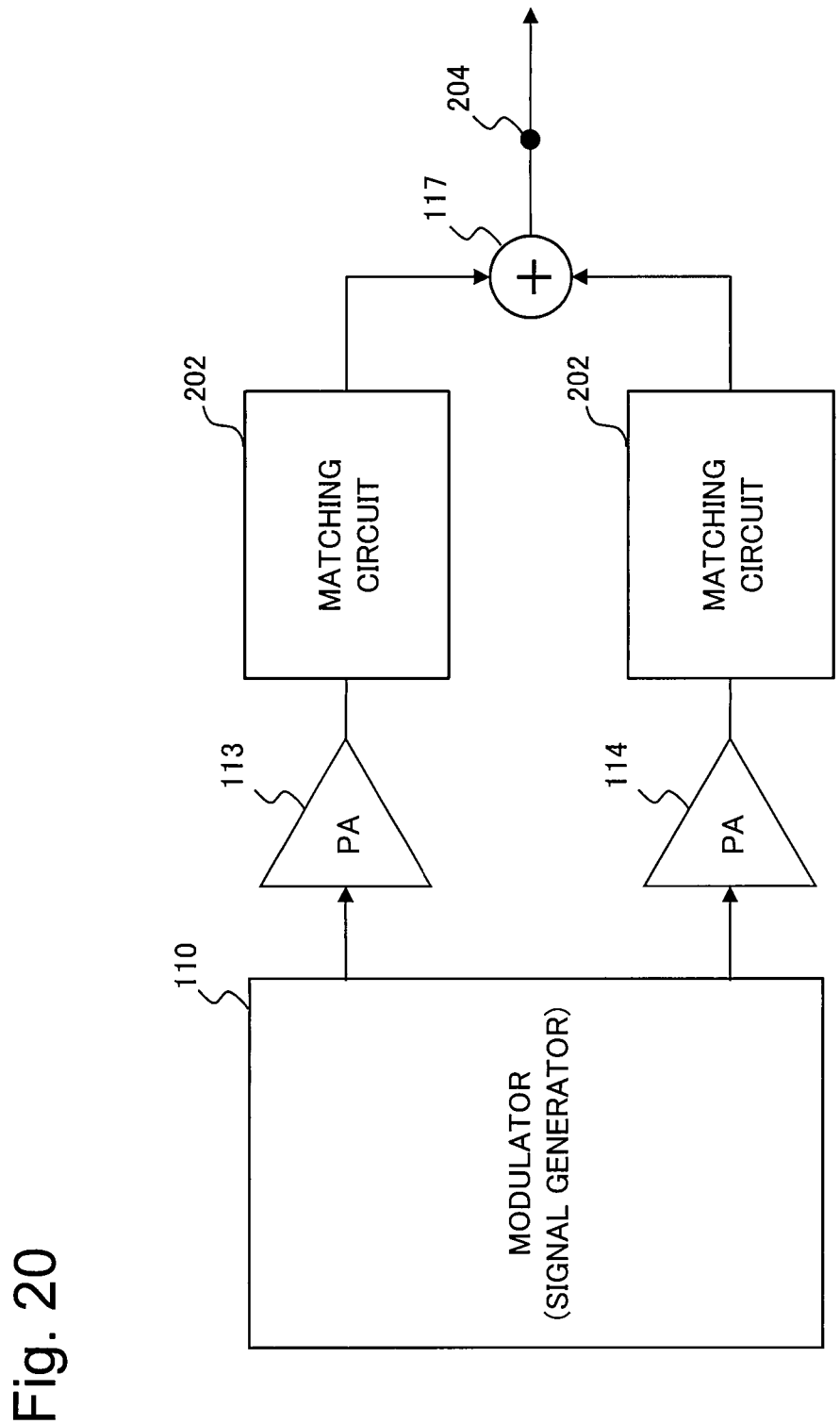

FIGS. 19 and 20 are block diagrams showing a functional configuration of a transmission device according to a fourth exemplary embodiment of the present invention. In one aspect of the present exemplary embodiment, as shown in FIG. 19, a matching circuit 201 is inserted between the combiner 117 and an output terminal 204, in order to achieve impedance matching between the combiner 117 and the output terminal 204. In another aspect of the present exemplary embodiment, as shown in FIG. 20, matching circuits 202 are inserted between the combiner 117 and the respective power amplifiers 113 and 114, in order to achieve impedance matching between the combiner 117 and each of the power amplifiers 113 and 114.

That is, the transmission device according to the fourth exemplary embodiment is characterized by its comprising a matching circuit, for impedance matching, at either of input and output ends of the combiner 117.

Except for the insertion of either of the matching circuits 201 and 202, configuration and operation of the transmission device according to the fourth exemplary embodiment are the same as that of the first to third exemplary embodiments. According to the fourth exemplary embodiment of the present invention, the same advantageous effect as that of the first to third exemplary embodiments is achieved.

(Fifth Exemplary Embodiment)

Figure 21:
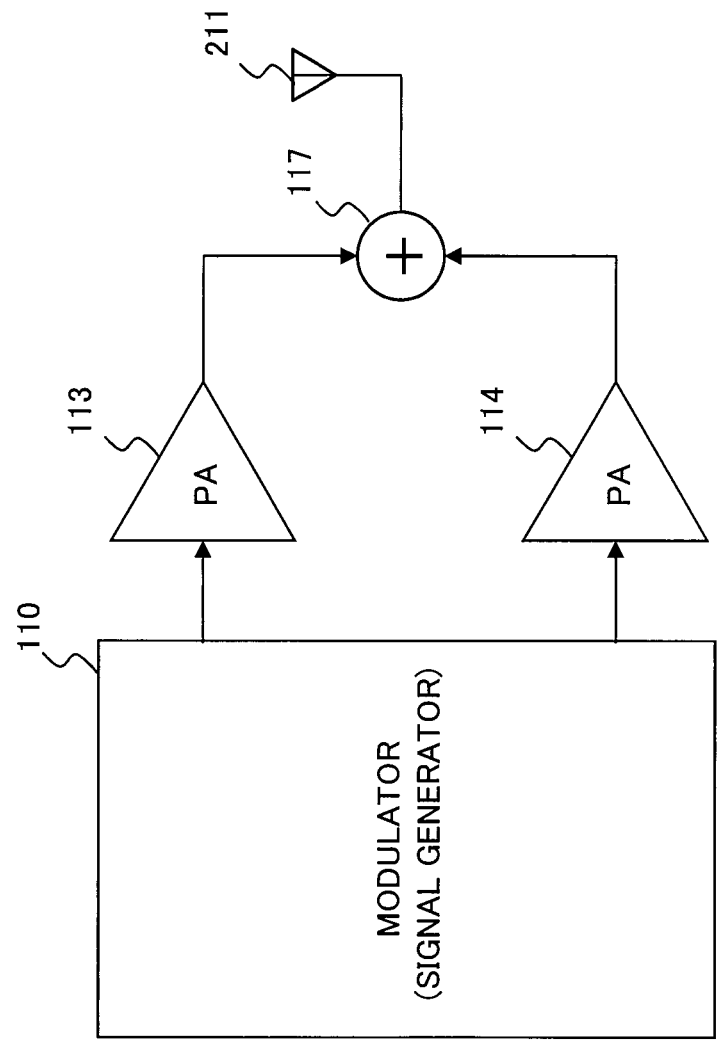
Figure 22:
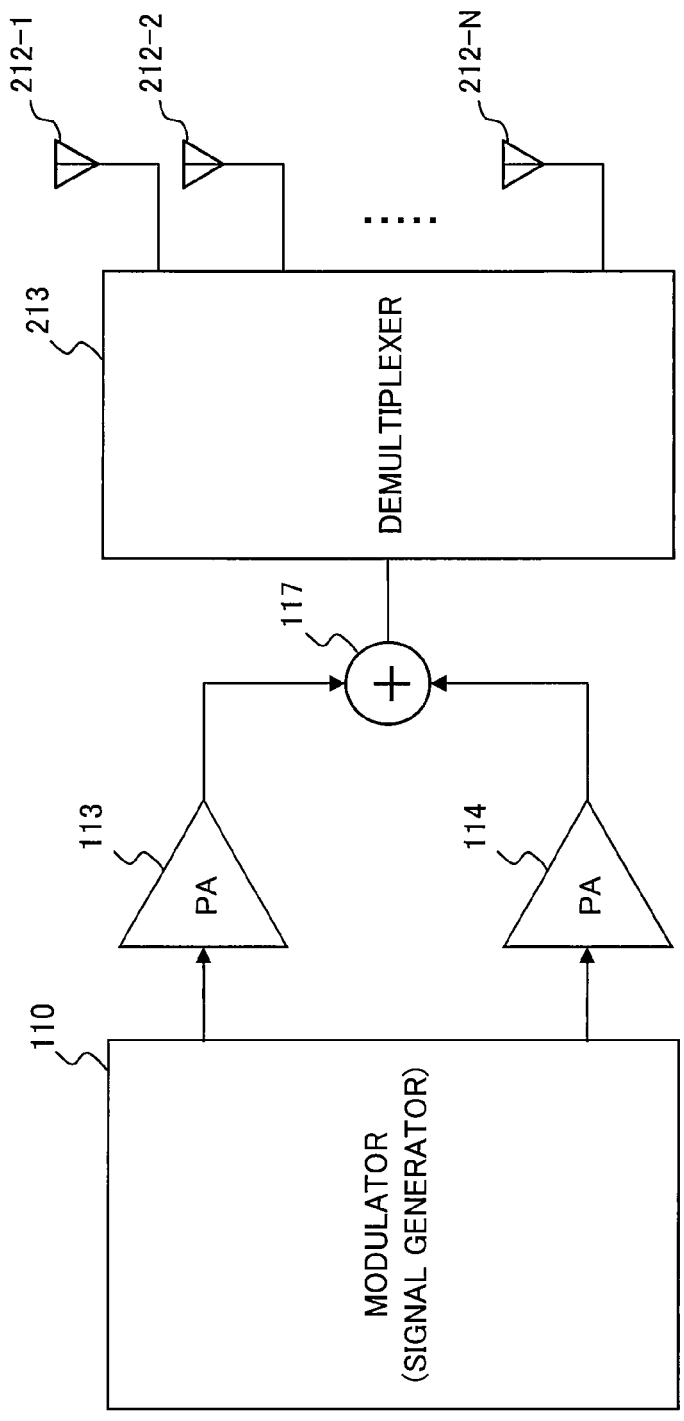

FIGS. 21 and 22 are block configuration diagrams showing a functional configuration of a transmission device according to a fifth exemplary embodiment of the present invention. The transmission device according to the present exemplary embodiment comprises an antenna (transmission means) for transmitting modulated RF signals of a plurality of bands. The transmission means can transmit at least a single band RF signal.

In one aspect of the present exemplary embodiment, as shown in FIG. 21, the modulated RF signals 118 (118-1 to 118-N) of a plurality of bands are transmitted by the use of a multiband antenna 211 disposed at the output end of the combiner 117.

In another aspect of the present exemplary embodiment, as shown in FIG. 22, the modulated RF signals 118 are split in terms of the respective frequency bands by a demultiplexer 213 disposed at the output end of the combiner 117, and each of the modulated RF signals thus split, 118-i, is transmitted by a corresponding one, 212-i, of antennas disposed at the output end of the demultiplexer 213. Here, the demultiplexer 213 is referred to also as a demultiplexing means. In the present aspect, the configuration is made such that the modulated signal 118-i of one frequency band i is transmitted by one corresponding antenna 212-i.

Expect for thus disposing the multiband antenna 211, or the antennas 212-1 to 212-N with the demultiplexer 213, configuration and operation of the transmission device according to the fifth exemplary embodiment is the same as that of the first to third exemplary embodiments. Also in the fifth exemplary embodiment of the present invention, the same advantageous effect as that of the first to third exemplary embodiments is achieved.

As has been described above, according to the exemplary embodiments of the present invention, it is possible, in a transmission device compatible with multiband communication, to transmit an RF signal of a plurality of bands by the use of only two power amplifiers, regardless of the number of bands used for the transmission.

That is, in the exemplary embodiments of the present invention, there is no need of increasing the number of power amplifiers even when the number of bands used for the transmission increases. Accordingly, the transmission device according to each of the exemplary embodiments of the present invention provides an effect of enabling reduction in the number of required power amplifiers, thereby enabling reduction in the cost and size of the transmission device, compared to the transmission devices according to the related technologies which require the same number of power amplifiers as the number of transmission bands. The effect of the transmission devices according to the exemplary embodiments of the present invention is significant particularly when the number of transmission bands is large.

Further, the transmission device according to each of the exemplary embodiments of the present invention provides an effect of achieving the following improvements compared with the transmission devices of the related technologies (disclosed in PTL 1 and PTL 2).

Firstly, differently from the related technology disclosed in PTL 1, the transmission devices of the present invention require no phase adjuster for adjusting the phases of RF signals inputted to the power amplifiers. Accordingly provided is an effect of simplifying the circuitry and no occurrence of amplitude error due to the phase adjuster itself.

Secondly, differently from the related technology disclosed in PTL 2, the transmission devices of the present invention provide an effect of making it possible to achieve both keeping high power efficiency and suppressing amplitude error in low output operation.

(Outphasing Technology)

Here, details of outphasing technology will be described using FIG. 16. Outphasing technology is referred to also as LINC (LInear amplification with Nonlinear Components) technology.

The outphasing signal generator 112 generates two RF signals of constant amplitude (constant envelope) from a baseband signal outputted from the baseband signal generator 111. The two constant-amplitude RF signals are amplified by the respective power amplifiers 113 or 114. The RF signals amplified by the respective power amplifiers 113 or 114 are combined together by the combiner 117. As a result of the combining by the combiner 117, a modulated RF signal carrying the baseband signal is restored from the two constant-amplitude RF signals. Then, the modulated RF signal is transmitted as a transmission signal.

Here, the modulated RF signal is represented by S(t), the two constant-amplitude RF signals by $S_a(t)$ and $S_b(t)$, respectively. Then, the signals are expressed, respectively, by the following equations 9 to 11.

$$S(t) = A(t)\cos(2\pi f_{ct} + \theta(t)) \quad (9)$$

$$S_a(t) = GA_{max} \cos(2\pi f_{ct} + \theta(t) + \alpha(t)) \quad (10)$$

$$S_b(t) = GA_{max} \cos(2\pi f_{ct} + \theta(t) - \alpha(t)) \quad (11)$$

Here, A(t) and θ(t) are, respectively, the amplitude and phase of a baseband signal carried by the modulated RF signal. $A_{max}$ represents the amplitude of the two constant-amplitude RF signals, and has a constant value. G is the gain of the power amplifiers 113 and 114. The amplitude of RF signals outputted from the respective power amplifiers 113 and 114, $GA_{max}$, is set at a value to make the power amplifiers 113 and 114 saturated. α(t) is a phase referred to as an outphasing angle. The outphasing angle α(t) plays the role of controlling the amplitude of a signal $S_a(t)+S_b(t)$ obtained by combining the two constant-amplitude RF signals. In particular, by setting the outphasing angle α(t) at a value given by the following equation 12, the amplitude of the modulated RF signal obtained by combining the two constant-amplitude RF signals can be set to be equal to the amplitude A(t) of the baseband signal to be carried.

$$\alpha(t) = \cos^{-1}[A(t)/GA_{max}] \quad (12)$$

Figure 23:
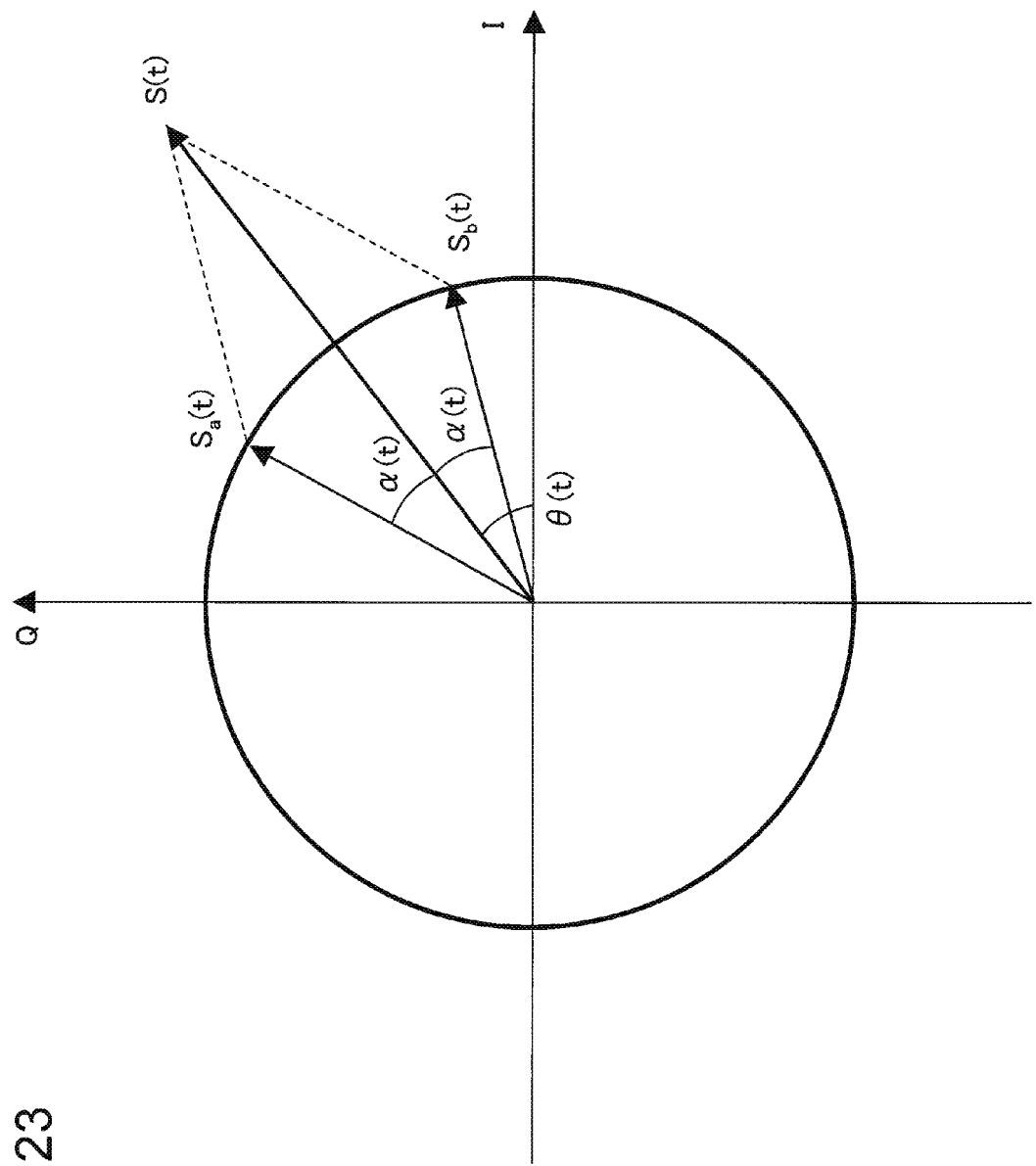
Figure 24:
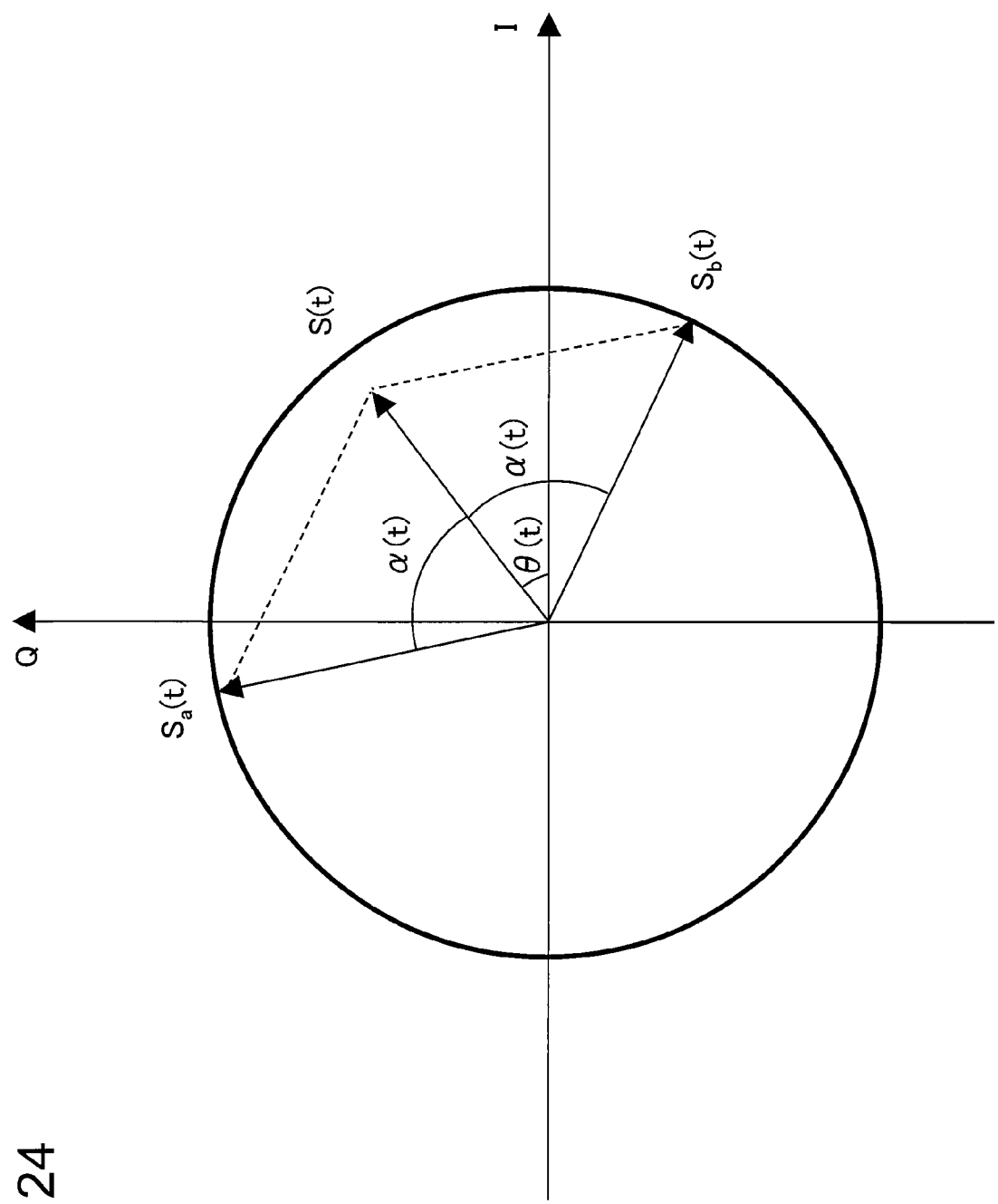

FIGS. 23 and 24 are vector diagrams each showing the two constant-amplitude RF signals $S_a(t)$ and $S_b(t)$ and the baseband signal carried by the modulated RF signal S(t). As shown in FIGS. 23 and 24, addition of two vectors respectively representing $S_a(t)$ and $S_b(t)$ yields a vector expressing the amplitude and phase of S(t). By increasing the outphasing angle α(t) from that of FIG. 23 to that of FIG. 24, the amplitude of S(t) can be decreased.

In the outphasing type PA shown in FIG. 16, the power amplifiers 113 and 114 each amplify a constant-amplitude RF signal. Accordingly, it is possible to keep the power amplifiers 113 and 114 always in saturated operation without setting a backoff, thereby keeping the power efficiency high. Further, keeping the linearity is realized at the same time, because the modulated RF signal is restored by the combiner 117.

Figure 25:
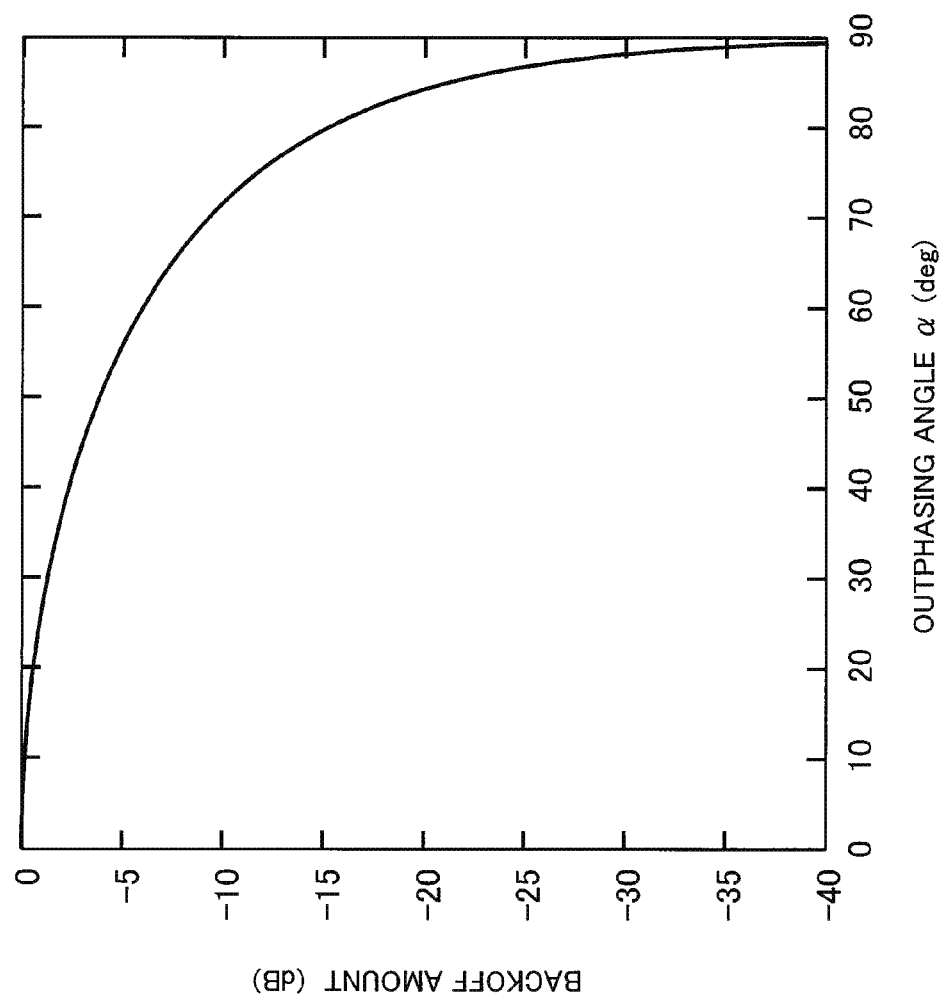

FIG. 25 shows a relationship between the amplitude of the modulated RF signal (backoff amount) and the outphasing angle α of the two constant-amplitude RF signals. The relationship of FIG. 25 was calculated according to the equation 12. It is seen in FIG. 25 that the amplitude of the modulated RF signal is decreased by increasing the outphasing angle α. Particularly in a region where the outphasing angle α is large (80 to 90 degrees), the amplitude largely changes with a slight change in α. This indicates that, when the amplitude is small, a slight amount of error of the outphasing angle α causes a large amount of error of the amplitude.

The present invention has been described above with reference to the exemplary embodiments, but the present invention is not limited to the above-described exemplary embodiments. To the configurations and details of the present invention, various changes and modifications which are understandable to those skilled in the art can be made within the scope of the present invention.

(Supplementary Note)

Part or the whole of the above-described exemplary embodiments may be described also as, but not limited to, the following supplementary notes.

(Supplementary Note 1)

A transmission device for transmitting an RF signal of a plurality of bands, the transmission device comprising:

a modulation means that generates a first constant-envelope signal and a second constant-envelope signal from each of baseband signals set for respective ones of the plurality of bands, the first constant-envelope signal and the second constant-envelope signal having different phases;

a power amplification means that amplifies each of the first constant-envelope signal and the second constant-envelope signal generated by the modulation means; and a combining means that combines the first constant-envelope signal and the second constant-envelope signal amplified by the power amplification means and generates an RF signal in which amplitude information contained in each of the baseband signals set for respective ones of the plurality of bands is restored.

(Supplementary Note 2)

The transmission device according to supplementary note 1, wherein:

the modulation means includes a plurality of baseband signal generation means that generates the baseband signals set for respective ones of the plurality of bands; and a plurality of constant-envelope signal generation means that generates the first constant-envelope signals and the second constant-envelope signals for respective ones of the plurality of bands, based on the baseband signals set for respective ones of the plurality of bands;

the power amplification means includes a first power amplification means that amplifies the first constant-envelope signal for each of the plurality of bands, and a second power amplification means that amplifies the second constant-envelope signal for each of the plurality of bands; and the combining means combines a plurality of RF signals amplified by the first and second power amplification means, and generates the RF signal in which amplitude information contained in each of the baseband signals set for respective ones of the plurality of bands is restored.

(Supplementary Note 3)

The transmission device according to supplementary note 2, wherein the modulation means includes, for each of the plurality of bands:

a quadrature modulation means that generates a quadrature-modulated signal and outputs the quadrature-modulated signal to both of the first and second power amplification means, the quadrature-modulated signal being an RF signal obtained by modulating a carrier wave of a band by the baseband signal corresponding to the band; and a mode switching means that selects one of the constant-envelop signal generation means and the quadrature modulation means as an output destination of the baseband signal corresponding to the band based on a preset determination criterion.

(Supplementary Note 4)

The transmission device according to supplementary note 3, wherein the mode switching means performs the switching, for the corresponding band, such that;

the baseband signal is outputted to the quadrature modulation means, if a determination index of the band is lower than the determination criterion; and the baseband signal is outputted to the constant-envelope signal generation means, if the determination index of the band is equal to or higher than the determination criterion.

(Supplementary Note 5)

The transmission device according to supplementary note 3 or 4, wherein based on a power threshold value preset for each of the plurality of bands, the mode switching means performs the switching, for each of the plurality of bands, in such a way that;

the baseband signal is outputted to the quadrature modulation means, in a case that a power of the RF signal outputted from the combining means is less than the power threshold value; and the baseband signal is outputted to the constant-envelope signal generation means, in a case that the power of the RF signal outputted from the combining means is equal to or larger than the power threshold value.

(Supplementary Note 6)

The transmission device according to any one of supplementary notes 3 to 5, wherein the mode switch ranks the plurality of bands in descending order of power magnitude in the RF signal outputted from the combining means, and sets a threshold value for number of bands to select, and the mode switching means performs the switching, for each of the plurality of bands, in such a way that:

the baseband signal is outputted to the quadrature modulation means, when the band is ranked lower than a rank that corresponding to the threshold value for the number of bands to select; and the baseband signal is outputted to the constant-envelope signal generation means, when the band is ranked equal to or higher than the rank that corresponding to the threshold value for the number of bands to select.

(Supplementary Note 7)

The transmission device according to any one of supplementary notes 2 to 6, wherein the modulation means sets amplitudes of the RF signals to be outputted to the first and second power amplification means in a manner to control total power of the RF signals outputted from the first and second power amplification means over all of the plurality of bands to be constant.

(Supplementary Note 8)

The transmission device according to any one of supplementary notes 2 to 7, wherein the modulation means sets the amplitudes of the RF signals outputted to the first and second power amplification means in such a way that the first and second power amplification means are saturated.

(Supplementary Note 9)

The transmission device according to any one of supplementary notes 1 to 8, comprising:

a transmission means capable of transmitting an RF signal of at least one band, wherein the transmission means transmits the RF signal generated by the combining means.

(Supplementary Note 10)

The transmission device according to any one of supplementary notes 1 to 9, comprising a matching circuit for performing impedance matching with respect to an output signal from the combining means.

(Supplementary Note 11)

The transmission device according to any one of supplementary notes 1 to 10, comprising matching circuits each for performing impedance matching by receiving an output signal from a corresponding one of the first and second power amplification means as its input, and outputting the impedance-matched signal to the combining means.

(Supplementary Note 12)

The transmission device according to any one of supplementary notes 1 to 11, comprising a transmission means capable of transmitting an RF signal of at least one band, wherein the transmission means transmits the RF signal generated by the combining means.

(Supplementary Note 13)

The transmission device according to any one of supplementary notes 1 to 12, comprising a demultiplexing means that demultiplexes an RF signal in terms of each band, and a plurality of antennas for transmitting the outputs of the demultiplexing means, wherein:

the demultiplexing means demultiplexes the RF signal of the plurality of bands into RF signals of the respective frequency bands, and outputs the demultiplexed RF signals to respective ones of the plurality of antennas; and the plurality of antennas transmit the respective RF signals outputted from the demultiplexing means.

(Supplementary Note 14)

The transmission device according to any one of supplementary notes 2 to 13, wherein:

the combining means includes a first reactance circuit receiving output of the first power amplification means as its input, a first transmission line receiving output of the first reactance circuit as its input and connected to an output terminal (of the combining means), a second reactance circuit receiving output of the second power amplification means as its input, and a second transmission line receiving output of the second reactance circuit as its input and connected to the output terminal;

the first and second transmission lines each have a characteristic equivalent to a transmission line having a quarter-wavelength electrical length in the plurality of bands; and the first and second reactance circuits have respective reactance values whose absolute values are the same as each other and whose positive/negative signs are opposite to each other, in the plurality of bands.

(Supplementary Note 15)

The transmission device according to any one of supplementary notes 2 to 14, wherein:

the combining means is composed of a transformer;

output terminals of respective ones of the first and second power amplification means are connected to different terminals of the transformer; and the remaining two terminals of the transformer are connected, respectively, to the output and ground terminals of the transmission device.

(Supplementary Note 16)

The transmission device according to any one of supplementary notes 2 to 15, wherein:

the combining means is composed of a transformer;

output terminals of respective ones of the first and second power amplification means are connected to respective ones of the two ends of the primary winding of the transformer; and the output and ground terminals of the transmission device are connected to respective ones of the two ends of the secondary winding of the transformer.

(Supplementary Note 17)

The transmission device according to any one of supplementary notes 2 to 15, wherein:

the combining means is composed of a transformer;

between output terminals of respective ones of the first and second power amplification means, one is connected to one end of the primary winding of the transformer and the other is to one end of the secondary winding; and between the output and ground terminals of the transmission device, one is connected to the other end of the primary winding of the transformer and the other terminal is to the other end of the secondary winding.

(Supplementary Note 18)

The transmission device according to any one of supplementary notes 2 to 17, wherein:

the combining means is composed of two transmission lines having different lengths; and one end of each of the two transmission lines is connected to the output terminal of the transmission device, and the other end of one of the two transmission lines and that of the other transmission line are connected, respectively, to the output terminals of respective ones of the first and second power amplification means.

(Supplementary Note 19)

A transmission method for transmitting an RF signal of a plurality of bands, the transmission method comprising:

generating a first constant-envelope signal and a second constant-envelope signal from each of baseband signals set for respective ones of the plurality of bands, the first constant-envelope signal and the second constant-envelope signal having different phases;

amplifying each of the first constant-envelope signal and the second constant-envelope signal generated by the modulation means; and combining the first constant-envelope signal and the second constant-envelope signal amplified by the power amplification means and generates an RF signal in which amplitude information contained in each of the baseband signals set for respective ones of the plurality of bands is restored.

(Supplementary Note 20)

A transmission method for transmitting an RF signal of a plurality of bands, the transmission method comprising:

selecting an outphasing operation for a band which is equal to or higher than a preset determination criterion among the plurality of bands; and selecting a linear amplification operation for a band which is lower than the preset determination criterion among the plurality of bands, wherein the outphasing operation includes generating a first constant-envelope signal and a second constant-envelope signal from each of baseband signals set for respective ones of the plurality of bands, the first constant-envelope signal and the second constant-envelope signal having different phases, amplifying the first constant-envelope signal and the second constant-envelope signal generated for each of the selected bands, combining the first and second constant-envelope signals amplified for each of the selected bands, and generating an RF signal, in which amplitude information contained in the baseband signal corresponding to each of the selected bands is restored, according to a phase difference between the first constant-envelope signal and the second constant-envelope signal for the band; and the linear amplification operation includes generating a quadrature-modulated signal that is an RF signal obtained by imposing a baseband signal corresponding to the band on a carrier wave of the band for each of the selected bands, amplifying the quadrature-modulated signal generated for each of the selected bands, combining the amplified quadrature-modulated signals for respective ones of the selected bands, and generating an RF signal, in which amplitude information contained in the baseband signal corresponding to each of the selected bands is restored according to the quadrature-modulated signal generated for the band.

The present invention has been described above with reference to the exemplary embodiments, but the present invention is not limited to the above-described exemplary embodiments. To the configurations and details of the present invention, various changes and modifications which are understandable to those skilled in the art can be made within the scope of the present invention.

REFERENCE SIGNS LIST 1 transmission device
10 modulation means
11 baseband signal generation means
12 constant-envelope signal generation means
13 mode switching means
14 quadrature modulation means
21 first combiner
22 second combiner
30 power amplification means
31 first power amplification means
32 second power amplification means
50 combining means
101 modulator
110 modulator
111 baseband signal generator
112 outphasing signal generator
113, 114 power amplifier
115, 116 RF signal
117 combiner
118 modulated RF signal
121, 122 combiner
123 mode switching unit
124 quadrature modulator
131, 151, 161 transmission line
133, 134 reactance circuit
141 transformer
143 ground terminal
144, 204 output terminal
171, 173 capacitive element
172, 174 inductive element
201, 202 matching circuit
211 multiband antenna
212 antenna
213 demultiplexer.

The invention claimed is:

1. A transmission device for transmitting an RF signal of a plurality of bands, the transmission device comprising:

a modulator that generates a first constant-envelope signal and a second constant-envelope signal from each of baseband signals set for respective ones of the plurality of bands, the first constant-envelope signal and the second constant-envelope signal having different phases;

a power amplifier that amplifies each of the first constant-envelope signal and the second constant-envelope signal generated by the modulator; and a combiner that combines the first constant-envelope signal and the second constant-envelope signal amplified by the power amplifier and generates an RF signal in which amplitude information contained in each of the baseband signals set for respective ones of the plurality of bands is restored, wherein the modulator includes:

a plurality of baseband signal generators that generates the baseband signals set for respective ones of the plurality of bands; and a plurality of constant-envelope signal generators that generates the first constant-envelope signals and the second constant-envelope signals for respective ones of the plurality of bands, based on the baseband signals set for respective ones of the plurality of bands;

wherein the power amplifier includes:

a first power amplifier that amplifies the first constant-envelope signal for each of the plurality of bands, and a second power amplifier that amplifies the second constant-envelope signal for each of the plurality of bands; and wherein the combiner combines the first envelop signals and the second envelop signals amplified by the first and second power amplifiers, and generates the RF signal in which amplitude information contained in each of the baseband signals set for respective ones of the plurality of bands is restored; and wherein the modulator include, for each of the plurality of bands, a quadrature modulator that generates a quadrature-modulated signal and outputs the quadrature-modulated signal to both of the first and second power amplifiers, the quadrature-modulated signal being an RF signal obtained by modulating a carrier wave of a band by the baseband signal corresponding to the band; and a mode switch that selects one of the constant-envelop signal generator and the quadrature modulator as an output destination of the baseband corresponding to the band based on a preset determination criterion.

2. The transmission device according to claim 1, wherein based on a power threshold value preset for each of the plurality of bands, the mode switch performs the switching, for each of the plurality of bands, in such a way that;

the baseband signal is outputted to the quadrature modulator, in a case that a power of the RF signal outputted from the combiner is less than the power threshold value; and the baseband signal is outputted to the constant-envelope signal generator, in a case that the power of the RF signal outputted from the combiner is equal to or larger than the power threshold value.

3. The transmission device according to claim 1, wherein
the mode switch ranks the plurality of bands in descending order of power magnitude in the RF signal outputted from the combiner, and sets a threshold value for number of bands to select, and
the mode switch performs the switching, for each of the plurality of bands, in such a way that:
the baseband signal is outputted to the quadrature modulator, when the band is ranked lower than a rank that corresponding to the threshold value for the number of bands to select; and
the baseband signal is outputted to the constant-envelope signal generator, when the band is ranked equal to or higher than the rank that corresponding to the threshold value for the number of bands to select.

4. The transmission device according to claim 1, wherein the modulator sets amplitudes of the RF signals to be outputted to the first and second power amplifier in a manner to control total power of the RF signals outputted from the first and second power amplifier over all of the plurality of bands to be constant.

5. The transmission device according to claim 1, wherein the modulator sets the amplitudes of the RF signals outputted to the first and second power amplifiers in such a way that the first and second power amplifiers are saturated.

6. The transmission device according to claim 1, comprising:
a transmitter capable of transmitting an RF signal of at least one band, wherein
the transmitter transmits the RF signal generated by the combiner.

7. A transmission method for transmitting an RF signal of a plurality of bands, the transmission method comprising:
generating a first constant-envelope signal and a second constant-envelope signal from each of baseband signals set for respective ones of the plurality of bands, the first constant-envelope signal and the second constant-envelope signal having different phases;
amplifying each of the first constant-envelope signal and the second constant-envelope signal generated for each of the plurality of bands;
combining the first constant-envelope signal and the second constant-envelope signal amplified for each of the plurality of bands and generates an RF signal in which amplitude information contained in each of the baseband signals set for respective ones of the plurality of bands is restored,
generating the baseboard signal set for respective ones of the plurality of bands;
generating the first constant-envelope signals and the second constant-envelope signals for respective ones of the plurality of bands, based on the baseband signals set for respective ones of the plurality of bands;
amplifying the first constant-envelope signal for each of the plurality of bands;
amplifying the second constant-envelope signal for each of the plurality of bands;
combining the amplified first envelop signals and the amplified second envelop signals; and
generating the RF signal in which amplitude information contained in each of the baseband signals set for respective ones of the plurality of bands is restored, and
for each of the plurality of bands,
generating a quadrature-modulated signal and outputting the quadratrue-modulated signal, the quadrature-modulated signal being are RF signal obtained by modulating a carrier wave of a band by the baseband signal corresponding to the band; and
selecting an output destination of the baseband signal corresponding to the band based on a preset determination criterion.

8. A transmission method for transmitting an RF signal of a plurality of bands, the transmission method comprising:
selecting an outphasing operation for a band whose power of the RF signal is equal to or higher than a preset determination criterion among the plurality of bands; and
selecting a linear amplification operation for a band whose power of the RF signal is lower than the preset determination criterion among the plurality of bands, wherein
the outphasing operation includes
generating a first constant-envelope signal and a second constant-envelope signal from each of baseband signals set for respective ones of the plurality of bands, the first constant-envelope signal and the second constant-envelope signal having different phases,
amplifying the first constant-envelope signal and the second constant-envelope signal generated for each of the selected bands,
combining the first and second constant-envelope signals amplified for each of the selected bands, and generating an RF signal, in which amplitude information contained in the baseband signal corresponding to each of the selected bands is restored, according to a phase difference between the first constant-envelope signal and the second constant-envelope signal for the band; and
the linear amplification operation includes
generating a quadrature-modulated signal that is an RF signal obtained by imposing a baseband signal corresponding to the band on a carrier wave of the band for each of the selected bands,
amplifying the quadrature-modulated signal generated for each of the selected bands,
combining the amplified quadrature-modulated signals for respective ones of the selected bands, and generating an RF signal, in which amplitude information contained in the baseband signal corresponding to each of the selected bands is restored according to the quadrature-modulated signal generated for the band.

* * * * *

UNITED STATES PATENT AND TRADEMARK OFFICE
CERTIFICATE OF CORRECTION

PATENT NO. : 9,813,090 B2
APPLICATION NO. : 15/105643
DATED : November 7, 2017
INVENTOR(S) : Shingo Yamanouchi Page 1 of 1

It is certified that error appears in the above-identified patent and that said Letters Patent is hereby corrected as shown below:

In the Claims

Claim 1, Column 26, Line 42: "include," has been replaced with --includes,--

Claim 1, Column 26, Line 53: after "baseband", insert --signal--

Claim 7, Column 28, Line 10: "quadratrue-modulated" has been replaced with --quadrature-modulated--

Claim 7, Column 28, Line 11: "are" has been replaced with --an--

Signed and Sealed this
Eighteenth Day of June, 2019

Andrei Iancu
*Director of the United States Patent and Trademark Office*